(12) United States Patent
Reese et al.

(10) Patent No.: US 10,901,560 B2
(45) Date of Patent: Jan. 26, 2021

(54) CHILDREN'S TOYS WITH CAPACITIVE TOUCH INTERACTIVITY

(71) Applicant: KIDS2, INC., Atlanta, GA (US)

(72) Inventors: Bradford Reese, Decatur, GA (US); Henrik Johansson, Ningbo (CN); Adam Shillito, Ningbo (CN); Tsz Kin Ho, Hong Kong (CN); Neil Ni, Ningbo (CN); Chun Chung Yeung, Hong Kong (CN); Qi He, ZhongShan (CN)

(73) Assignee: KIDS2, INC., Atlanta, GA (US)

( * ) Notice: Subject to any disclaimer, the term of this patent is extended or adjusted under 35 U.S.C. 154(b) by 0 days.

(21) Appl. No.: 16/241,601

(22) Filed: Jan. 7, 2019

(65) Prior Publication Data

US 2019/0212843 A1    Jul. 11, 2019

Related U.S. Application Data

(60) Provisional application No. 62/614,683, filed on Jan. 8, 2018, provisional application No. 62/722,082, filed on Aug. 23, 2018.

(51) Int. Cl.
| G06F 3/044 | (2006.01) |
| A63H 5/00 | (2006.01) |
| G09B 5/06 | (2006.01) |
| G09B 15/00 | (2006.01) |

(52) U.S. Cl.
CPC ............... *G06F 3/044* (2013.01); *A63H 5/00* (2013.01); *G09B 5/06* (2013.01); *G09B 15/00* (2013.01); *A63H 2200/00* (2013.01)

(58) Field of Classification Search
CPC ....... G06F 3/044; A63H 5/00; A63H 2200/00; G09B 5/06; G09B 15/00

USPC .......................................................... 84/470 R
See application file for complete search history.

(56) References Cited

U.S. PATENT DOCUMENTS

| 4,801,771 A | * | 1/1989 | Mizuguchi | ........... G10H 1/0558 |
| | | | | 178/18.05 |
| 4,892,023 A | * | 1/1990 | Takeuchi | ............. G10H 1/0556 |
| | | | | 84/687 |
| 4,899,631 A | * | 2/1990 | Baker | ..................... G10H 1/053 |
| | | | | 84/433 |
| 4,911,053 A | * | 3/1990 | Kashio | ...................... G10H 3/18 |
| | | | | 84/725 |

(Continued)

FOREIGN PATENT DOCUMENTS

| JP | 2015118398 A | * | 6/2015 |
| JP | 2015118398 A | | 6/2015 |

(Continued)

OTHER PUBLICATIONS

International Search Report and Written Opinion for PCT/US2019/012529; dated Mar. 22, 2019; 15 pgs.

*Primary Examiner* — David S Warren
*Assistant Examiner* — Christina M Schreiber
(74) *Attorney, Agent, or Firm* — Gardner Groff & Greenwald, PC

(57) ABSTRACT

A children's toy with capacitive touch interactivity. The children's toy generally includes a user input overlay panel and one or more capacitive touch sensors. The overlay panel may be formed from a capacitive touch conductive natural organic material such as wood. The toy can be shaped and ornamented to resemble a musical instrument, and configured to play music in response to user input applied to the user input overlay panel and sensed by the capacitive touch sensors.

26 Claims, 19 Drawing Sheets

(56) References Cited

U.S. PATENT DOCUMENTS

| | | | | |
|---|---|---|---|---|
| 5,135,426 A * | 8/1992 | Lin | G10H 1/26 | 446/397 |
| 5,145,447 A * | 9/1992 | Goldfarb | A63F 3/0421 | 369/30.02 |
| 5,248,843 A * | 9/1993 | Billings | A63H 5/00 | 84/609 |
| 5,496,179 A * | 3/1996 | Hoffman | G09B 15/003 | 434/433 |
| 5,538,430 A * | 7/1996 | Smith | B42D 3/123 | 434/178 |
| 5,545,071 A * | 8/1996 | Shiraishi | A63H 5/00 | 446/143 |
| 5,883,325 A * | 3/1999 | Peirce | G10H 1/0008 | 84/602 |
| 6,142,849 A * | 11/2000 | Horton | G10H 1/00 | 446/175 |
| 6,274,800 B1 * | 8/2001 | Gardner | G10H 1/32 | 446/408 |
| 6,443,794 B2 * | 9/2002 | Oren | A63H 33/00 | 446/227 |
| 6,454,627 B1 * | 9/2002 | Mak | A63H 3/003 | 446/297 |
| 6,586,666 B2 * | 7/2003 | Abe | G10H 1/0016 | 84/411 R |
| 6,955,603 B2 * | 10/2005 | Jeffway, Jr. | A63F 13/06 | 463/36 |
| 7,728,209 B1 * | 6/2010 | Arnold | H04M 1/21 | 84/29 |
| 8,003,877 B2 * | 8/2011 | Elion | G10H 1/0066 | 84/646 |
| 8,008,563 B1 * | 8/2011 | Hastings | G09B 15/04 | 84/479 A |
| 8,093,482 B1 * | 1/2012 | Kramer | G10H 1/0016 | 84/485 R |
| 8,098,240 B2 * | 1/2012 | Zielinski | A63F 3/00643 | 345/174 |
| 8,235,824 B2 * | 8/2012 | Kuhn | G07F 17/322 | 463/46 |
| 8,373,672 B2 * | 2/2013 | Wallace | H03K 17/962 | 345/173 |
| 8,378,203 B2 * | 2/2013 | Wallace | G10H 1/0551 | 84/733 |
| 8,395,040 B1 | 3/2013 | Kramer et al. | | |
| 8,471,138 B2 * | 6/2013 | Wallace | G10H 1/342 | 84/733 |
| 8,476,519 B2 * | 7/2013 | Liotta | H04R 1/1033 | 84/615 |
| 8,614,389 B2 * | 12/2013 | Wallace | G10H 1/0551 | 84/733 |
| 8,729,379 B2 * | 5/2014 | Wallace | B42D 15/022 | 84/733 |
| 8,735,710 B2 * | 5/2014 | Yamabata | G10H 3/26 | 84/627 |
| 8,773,387 B2 * | 7/2014 | Wallace | H03K 17/975 | 345/173 |
| 8,816,181 B2 * | 8/2014 | Shemesh | G10H 3/146 | 84/658 |
| 8,865,992 B2 * | 10/2014 | Shavit | G10H 3/186 | 84/615 |
| 8,878,042 B2 * | 11/2014 | Van Wagoner | G09B 15/06 | 84/609 |
| 9,092,096 B2 * | 7/2015 | Li | G06F 3/0445 | |
| 9,093,059 B2 * | 7/2015 | Dejima | G10H 3/12 | |
| 9,111,516 B1 * | 8/2015 | Saraceni | G10H 1/0016 | |
| 9,299,330 B2 * | 3/2016 | Shi | C12N 9/52 | |
| 9,311,907 B2 * | 4/2016 | Beck | G10H 1/0016 | |
| 9,324,310 B2 * | 4/2016 | McPherson | G06F 3/044 | |
| 9,583,087 B2 * | 2/2017 | Iwase | G10H 1/0556 | |
| 9,620,096 B2 * | 4/2017 | Ambrosino | G10H 3/186 | |
| 9,628,880 B2 * | 4/2017 | Koss | H04R 1/02 | |
| 9,761,210 B2 * | 9/2017 | McPherson | G06F 3/03547 | |
| 9,773,487 B2 * | 9/2017 | Alt | G10H 1/0551 | |
| 9,805,705 B2 | 10/2017 | McPherson et al. | | |
| 9,836,151 B2 * | 12/2017 | McMillen | G06F 3/04144 | |
| 9,837,062 B2 * | 12/2017 | Wernick | G10H 1/14 | |
| 10,288,507 B2 * | 5/2019 | McMillen | G05B 19/056 | |
| 2009/0139798 A1 * | 6/2009 | Bernard | E06C 7/003 | 182/18 |
| 2009/0260508 A1 * | 10/2009 | Elion | G10H 1/0066 | 84/646 |
| 2009/0266218 A1 * | 10/2009 | Parienti | G10C 3/12 | 84/171 |
| 2011/0239848 A1 * | 10/2011 | Beck | G10H 1/0551 | 84/726 |
| 2012/0024132 A1 * | 2/2012 | Wallace | G10H 1/22 | 84/689 |
| 2012/0247308 A1 * | 10/2012 | Tsai | G06F 3/0421 | 84/658 |
| 2013/0074680 A1 * | 3/2013 | Elion | G10H 1/342 | 84/646 |
| 2013/0083946 A1 * | 4/2013 | Liu | H03K 17/9622 | 381/109 |
| 2016/0035240 A1 * | 2/2016 | Camp | G09B 15/00 | 84/470 R |
| 2016/0109976 A1 * | 4/2016 | Nguyen | G06F 15/0291 | 345/174 |
| 2017/0040553 A1 * | 2/2017 | Watabe | G06F 3/0416 | |
| 2017/0136380 A1 * | 5/2017 | Creedican | A63H 33/06 | |
| 2017/0162070 A1 * | 6/2017 | Grafman | G09B 15/002 | |
| 2018/0033211 A1 * | 2/2018 | Berman | H04N 13/344 | |
| 2018/0204884 A1 * | 7/2018 | Isa | G06F 3/041 | |
| 2019/0212843 A1 * | 7/2019 | Reese | G06F 3/044 | |
| 2020/0316483 A1 * | 10/2020 | Reese | A63H 5/00 | |

FOREIGN PATENT DOCUMENTS

| | | |
|---|---|---|
| WO | 2007009251 A1 | 1/2007 |
| WO | 2011100441 A1 | 8/2011 |

* cited by examiner

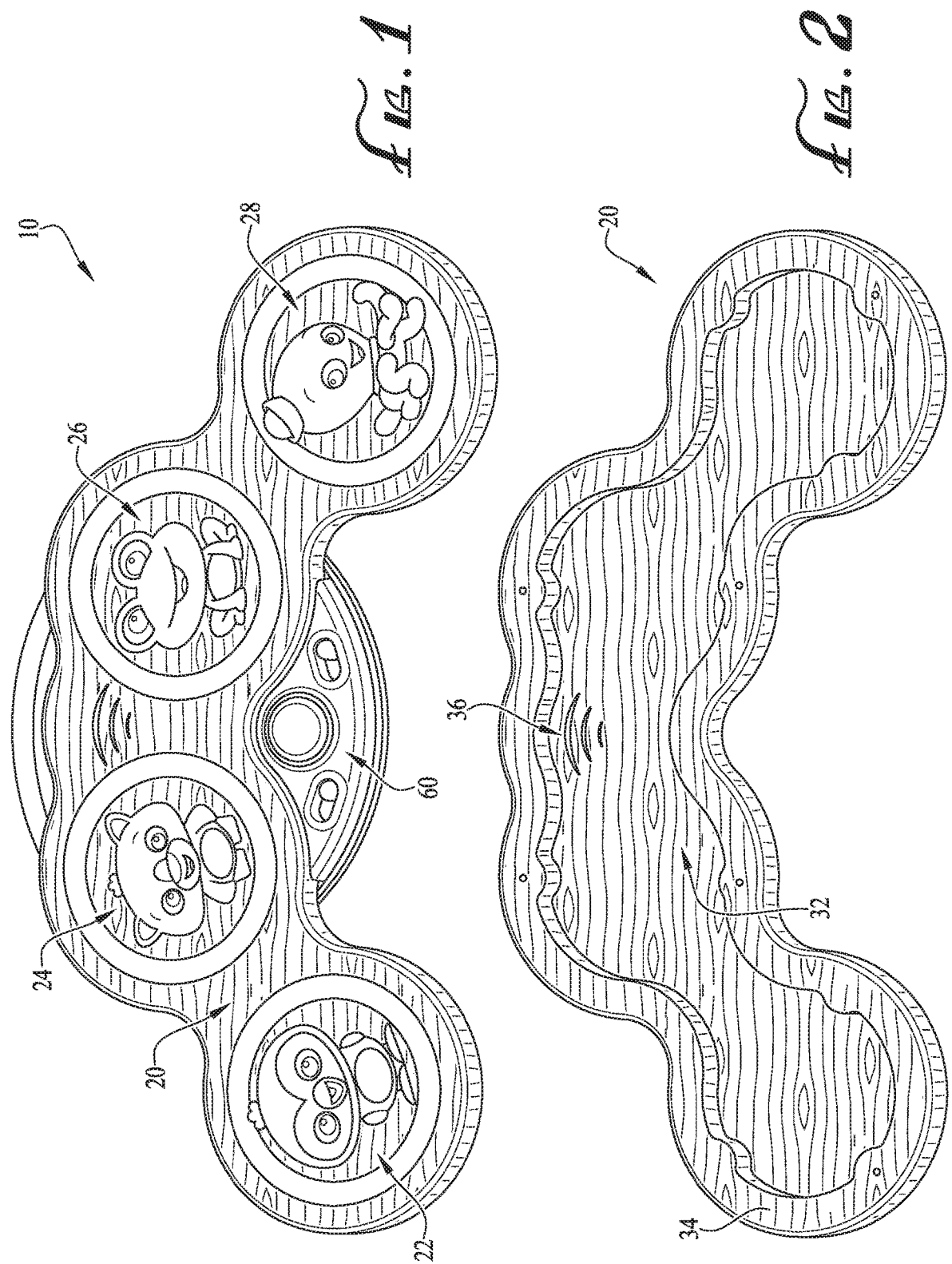

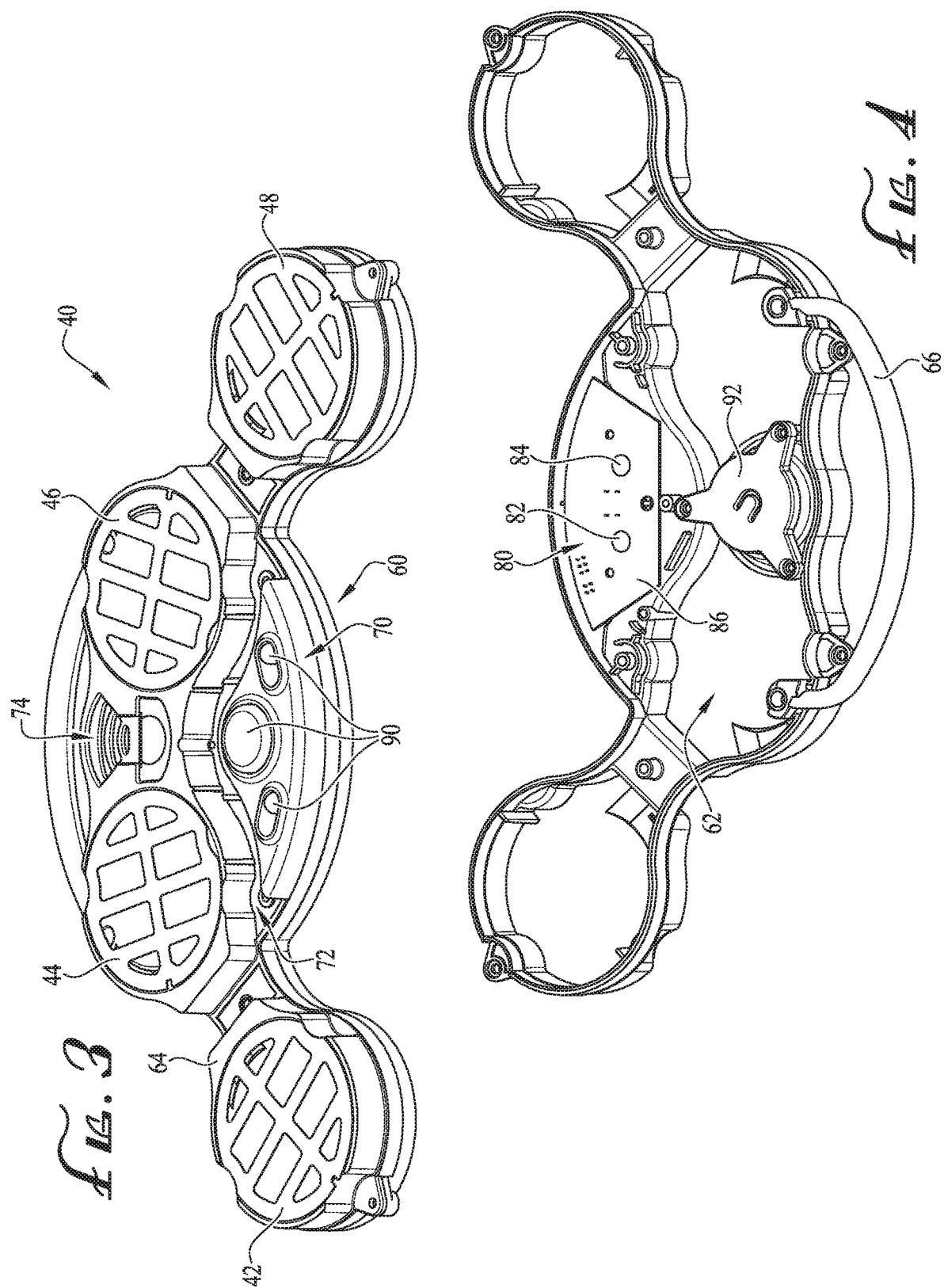

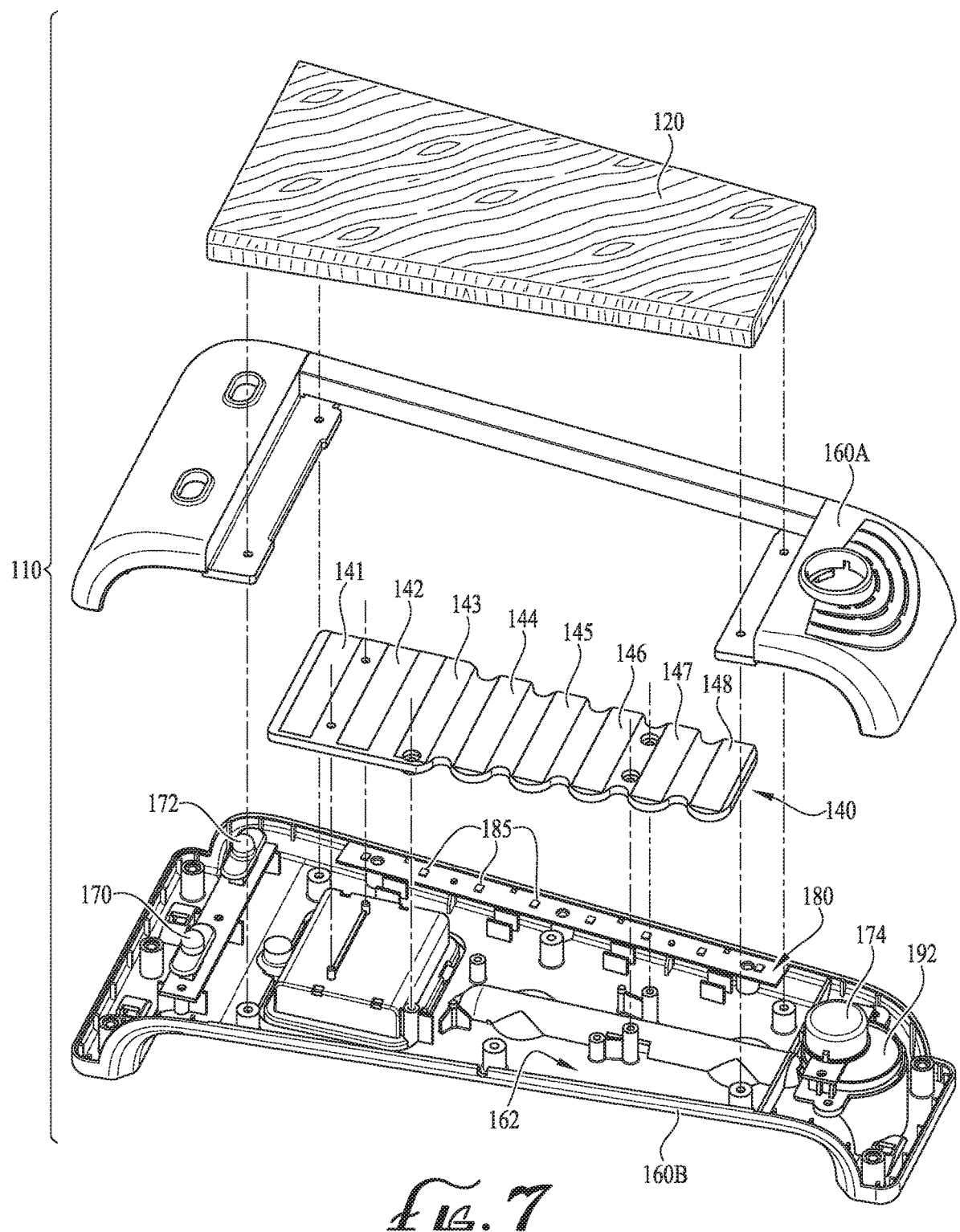

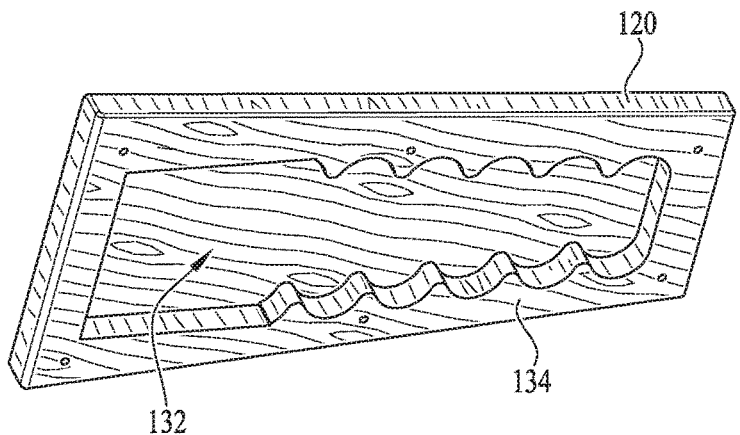
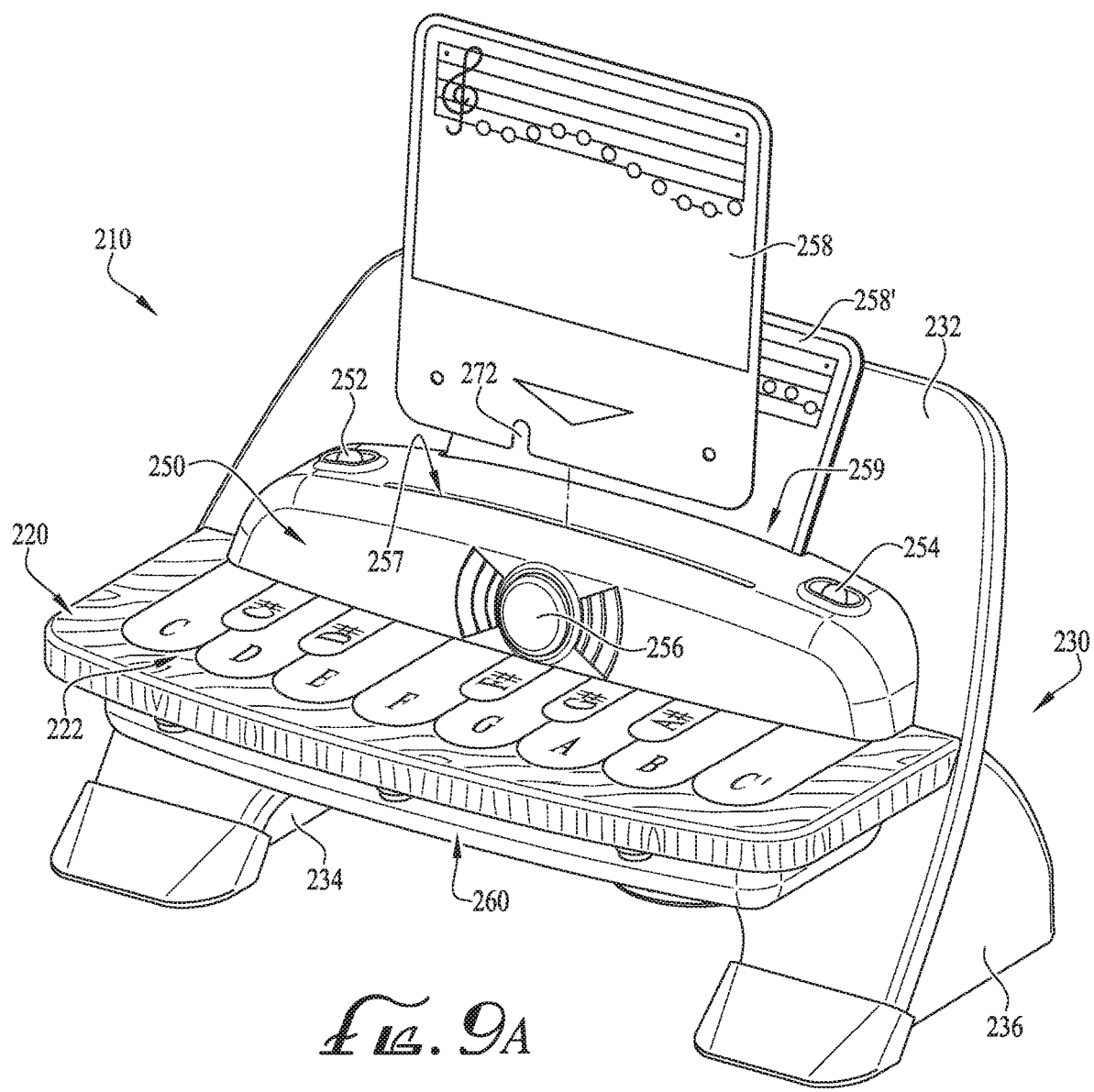

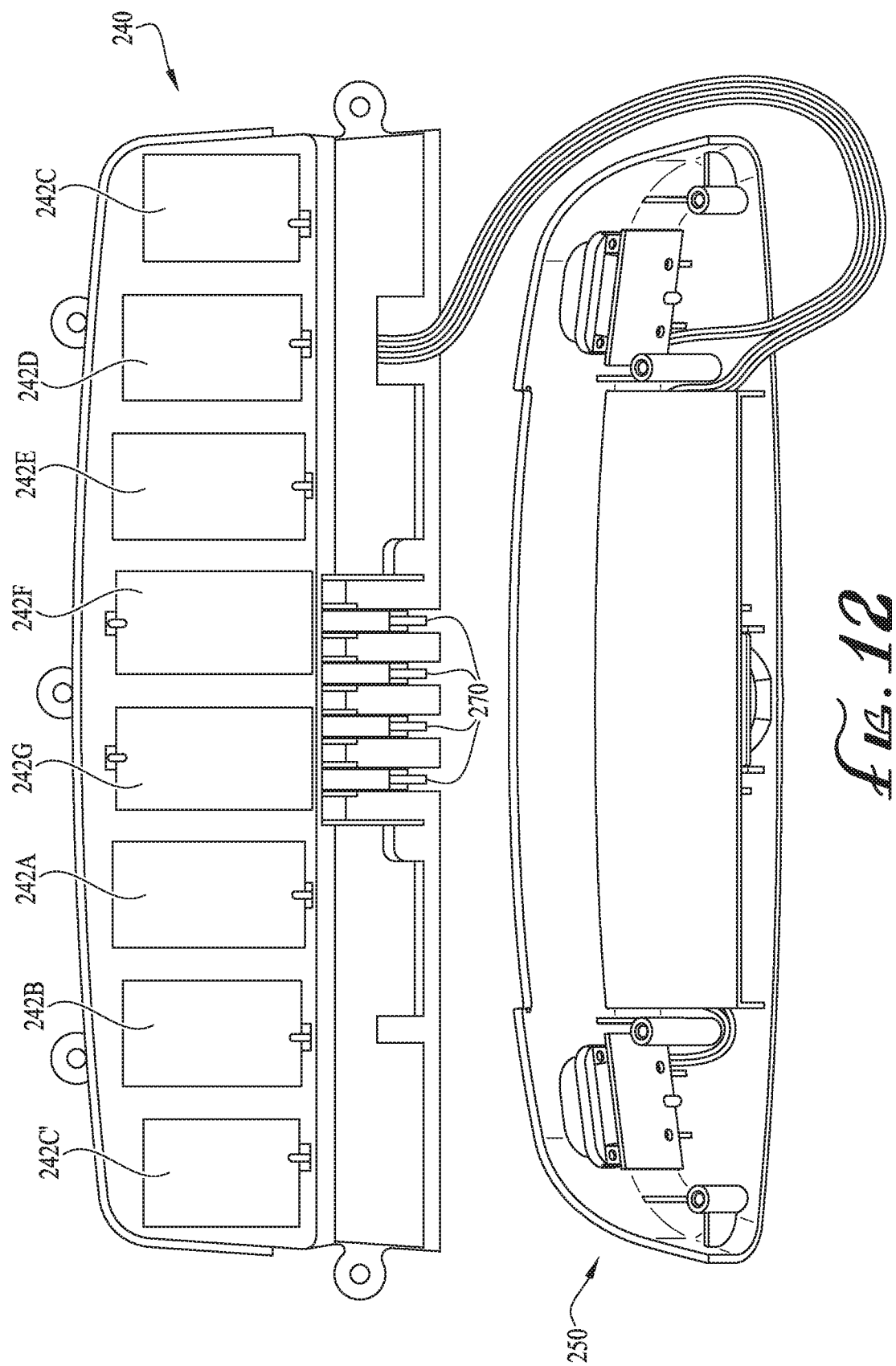

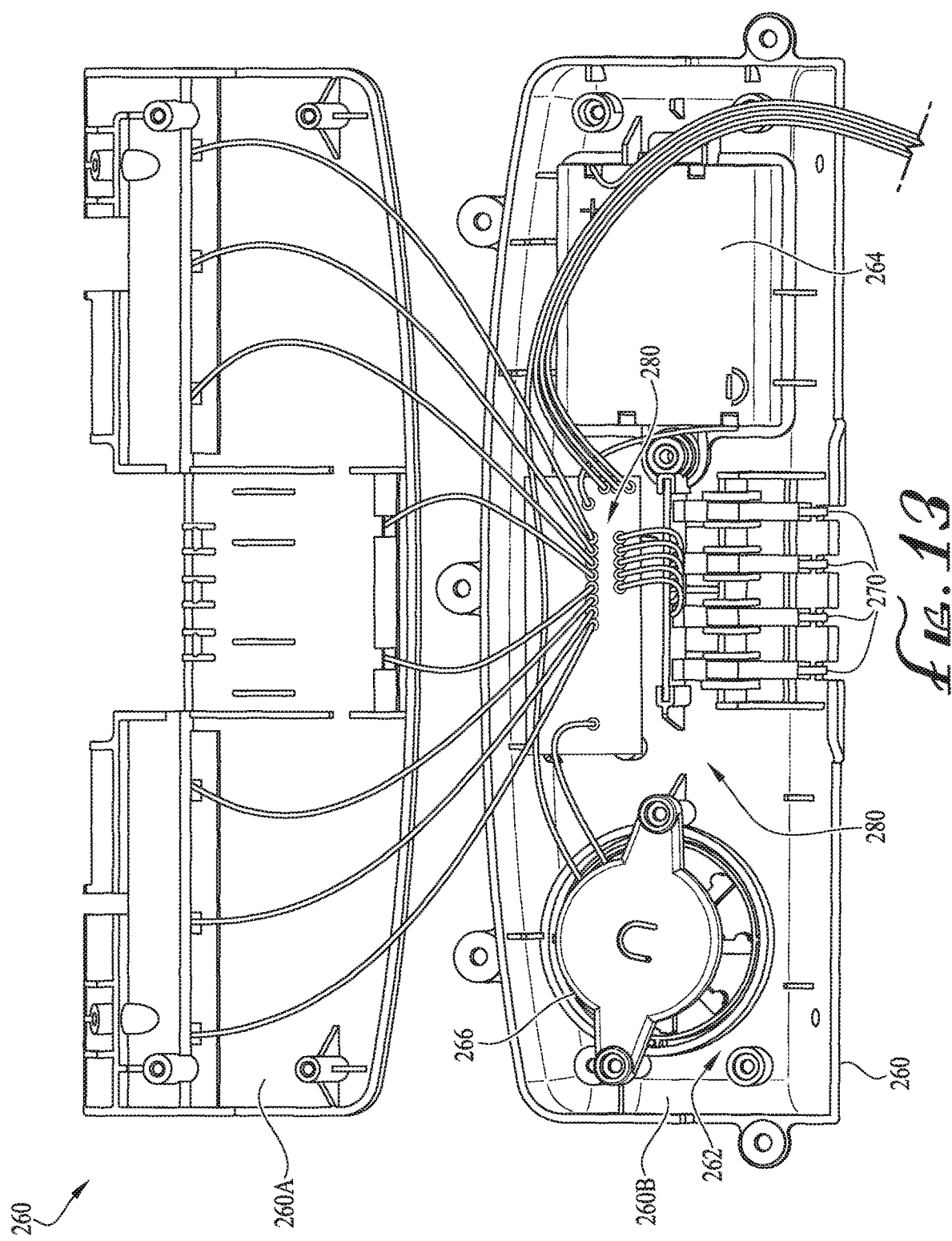

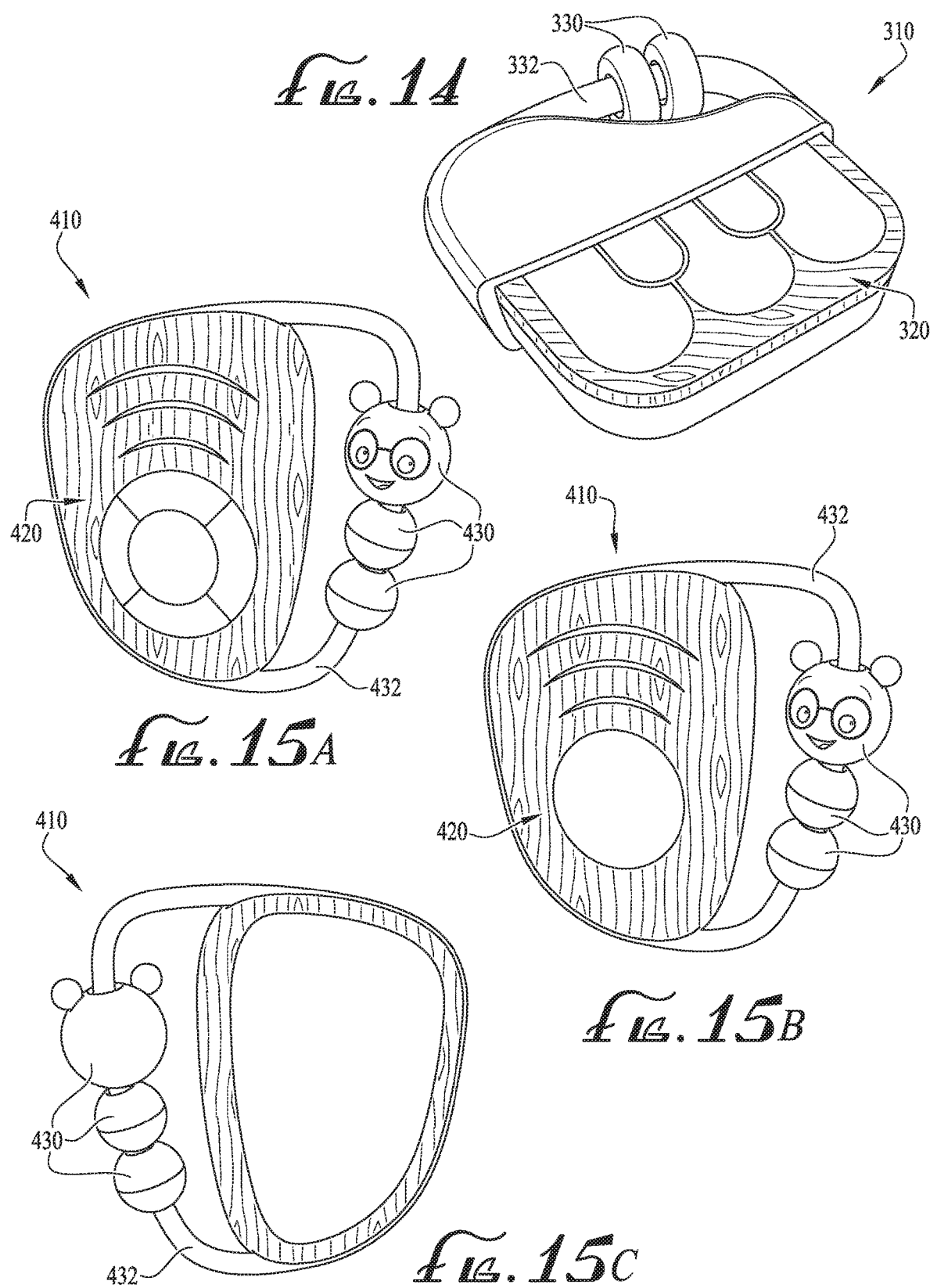

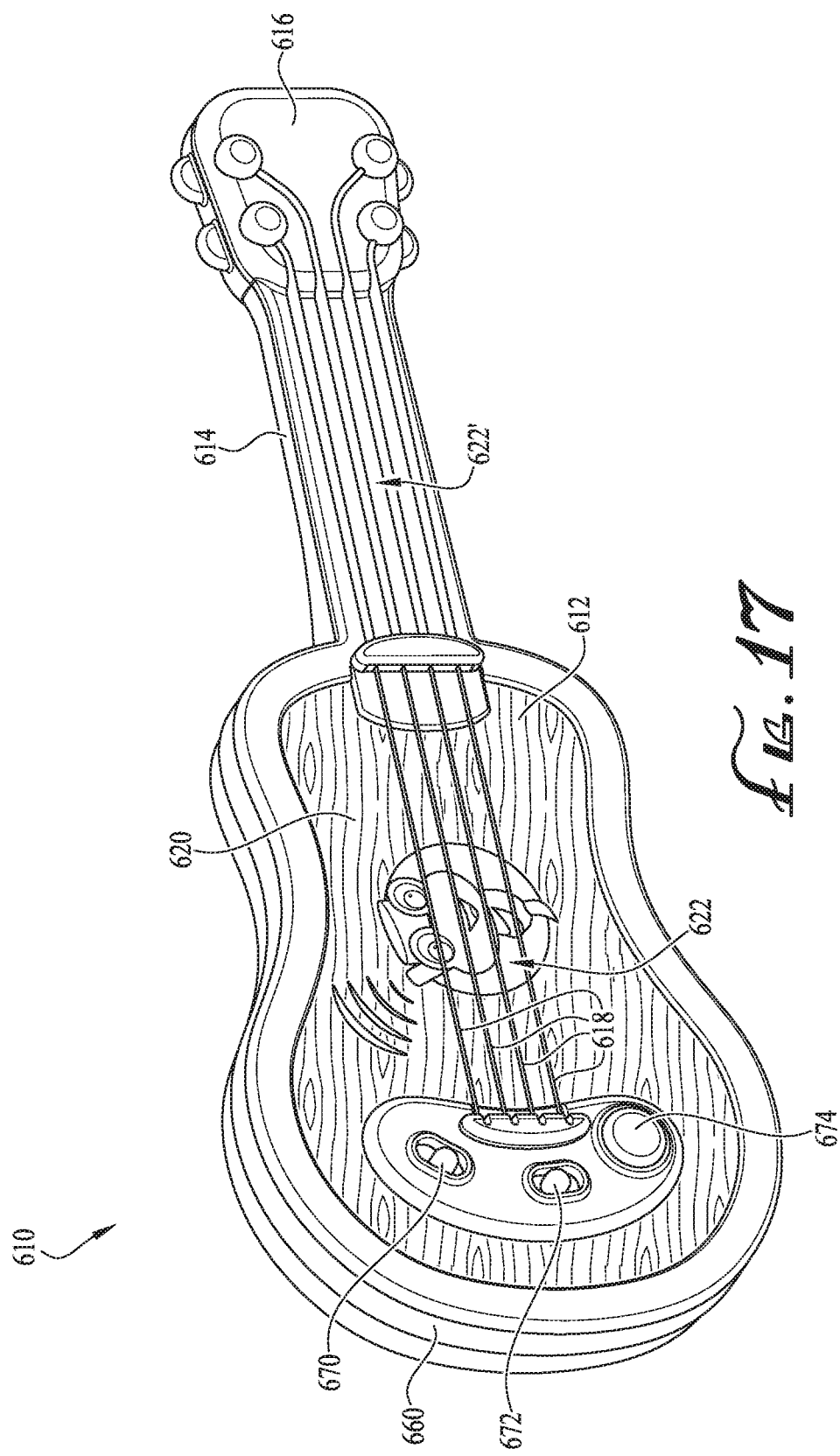

CHILDREN'S TOYS WITH CAPACITIVE TOUCH INTERACTIVITY

CROSS-REFERENCE TO RELATED APPLICATIONS

This application claims the benefit of U.S. Provisional Patent Application Ser. No. 62/614,683 filed Jan. 8, 2018, and U.S. Provisional Patent Application Ser. No. 62/722,082 filed Aug. 23, 2018, the entireties of which are hereby incorporated herein by reference for all purposes.

TECHNICAL FIELD

The present disclosure relates generally to the field of interactive children's toys and capacitive touch sensing technologies.

BACKGROUND

Interactive toys stimulate and entertain children and contribute to childhood development. Electronic capacitive touch sensing technologies provide means for user input to interactive devices. Continuing improvements to products in these fields are sought. It is to the provision of children's toys and other interactive products having new and improved capacitive touch sensor-based user input means that the present disclosure is primarily directed.

SUMMARY

In example embodiments, the present disclosure relates to an interactive children's toy or other device, having capacitive touch user input technology. The children's toy or other device generally includes at least one capacitive touch sensor user input, coupled to an integrated circuit or other electronic processing device, and one or more output features or components for delivering entertaining, educational, and/or output or feedback to the user in response to the user input. In example embodiments, the output may be in the form of music, voice or other sound, color or light, electronic data, text display, motor operation, magnetic actuator operation, and/or other output content or format.

In example embodiments, a user input of a device according to the present disclosure comprises a smooth and continuous seamless surface, for example formed of a thin panel of wood overlying one or more capacitive touch sensors, with user-input areas indicated or defined on the surface, for example by painting, stain, or decals applied onto the wood panel. The provision of a smooth and continuous seamless user input surface eliminates or minimizes crevices or recesses where dirt, food residue or other debris might collect, making it easier to clean the device, and preventing interference with internal electronics, switches or other components.

In example embodiments, the capacitive touch user input includes an overlay layer, a sensor layer, and a base or substrate layer. One or more of the overlay layer, sensor layer, and base layer can be manufactured from a flexible substrate, enabling the capacitive touch device to be installed in various arrangements tailored to the shape of the device in which the capacitive touch device is implemented. In the example embodiments, the overlay layer is formed from a capacitive discharge conductive organic material such as wood. The wood overlay layer can be shaped and ornamented to resemble a musical instrument.

In one aspect, the present disclosure relates to a children's toy having an overlay layer having a top surface and a bottom surface, a base layer having at least one output device, and a sensor layer that directly touches the bottom surface of the overlay layer. Touching the top surface of the overlay layer activates the sensor layer and triggers an output from the at least one output device. In example embodiments, the overlay layer is formed from a wood material.

In another aspect, the present disclosure relates to a children's toy. The children's toy preferably includes a user input panel having a top surface and a bottom surface, the top surface defining at least one user input area for touch contact by a user. The user input panel is preferably formed from a natural wood material. The children's toy preferably also includes at least one capacitive touch sensor in operative contact with the bottom surface of the user input panel and in operative alignment with the at least one user input area. Touch contact by the user on the at least one user input area of the top surface of the user input panel is sensed by the at least one capacitive touch sensor to generate an input signal. The children's toy preferably also includes an electronic input-output control system configured to receive the input signal generated by the at least one capacitive touch sensor upon touch contact by the user on the at least one user input area, and to generate a responsive output signal. The children's toy preferably also includes an output device configured to receive the output signal from the control system and generate a user-perceptible output in response thereto.

In another aspect, the present disclosure relates to a capacitive touch sensing apparatus including a user input panel formed from a natural organic material, at least one capacitive touch sensor configured to sense user input through the user input panel, and an output device configured to generate an output in response to the user input.

In another aspect, the present disclosure relates to a children's drum toy including at least one simulated drum head having an exterior user input surface, and an interior surface opposite the exterior user input surface. The children's drum toy preferably also includes a capacitive touch sensor associated with each of the at least one simulated drum heads, and in operative contact with the interior surface thereof, and a sound output device for generating a simulated drum sound responsive to user contact with the exterior user input surface of each of the at least one simulated drum heads.

In another aspect, the present disclosure relates to a children's piano toy including a user input panel in the form of a simulated keyboard. The user input panel preferably has an exterior surface and an opposite interior surface. The simulated keyboard preferably includes a plurality of user input areas on the exterior surface configured to resemble piano keys. The children's piano toy preferably also includes at least one capacitive touch sensor in operative contact with the interior surface of the user input panel, and configured to sense user contact with the plurality of user input areas, and a sound output device for generating a simulated piano sound responsive to user contact with the plurality of user input areas.

These and other aspects, features and advantages of the disclosed example embodiments will be understood with reference to the drawing figures and detailed description herein, and will be realized by means of the various elements and combinations particularly pointed out in the appended claims. It is to be understood that both the foregoing general description and the following brief description of the drawings and detailed description of example embodiments are explanatory of example embodiments of the invention, and are not restrictive of the invention, as claimed.

BRIEF DESCRIPTION OF THE DRAWINGS

FIG. 1 is a top perspective view of a children's drum toy with capacitive touch sensor user input features, according to an example embodiment of the present disclosure.

FIG. 2 is a bottom perspective view of the user-input overlay layer or cover panel of the children's drum toy of FIG. 1.

FIG. 3 is a top perspective view of the capacitive touch sensor layer and the base layer of the children's drum toy of FIG. 1.

FIG. 4 shows a partially disassembled view of the base, showing internal components of the children's drum toy of FIG. 1.

FIG. 7 is an assembly view of the children's xylophone toy of FIG. 5.

FIG. 8 is a bottom perspective view of the user-input overlay layer or cover panel of the children's xylophone toy of FIG. 5.

FIGS. 9A and 9B show front perspective views of a children's keyboard toy with capacitive touch sensor user input features, and indexed song cards, respectively, according to another example embodiment of the present disclosure.

FIGS. 12 and 13 are partially disassembled views of an electronics housing portion of the children's keyboard toy of FIG. 9, showing internal components.

FIGS. 14, 15A, 15B and 15C, and 16A, 16B and 16C show children's toys with capacitive touch sensor user inputs according to additional example embodiments of the present disclosure.

FIG. 17 is a front perspective view of a children's ukulele or guitar toy with capacitive touch sensor user input features according to another example embodiment of the present disclosure.

DETAILED DESCRIPTION OF EXAMPLE EMBODIMENTS

Figure 5:
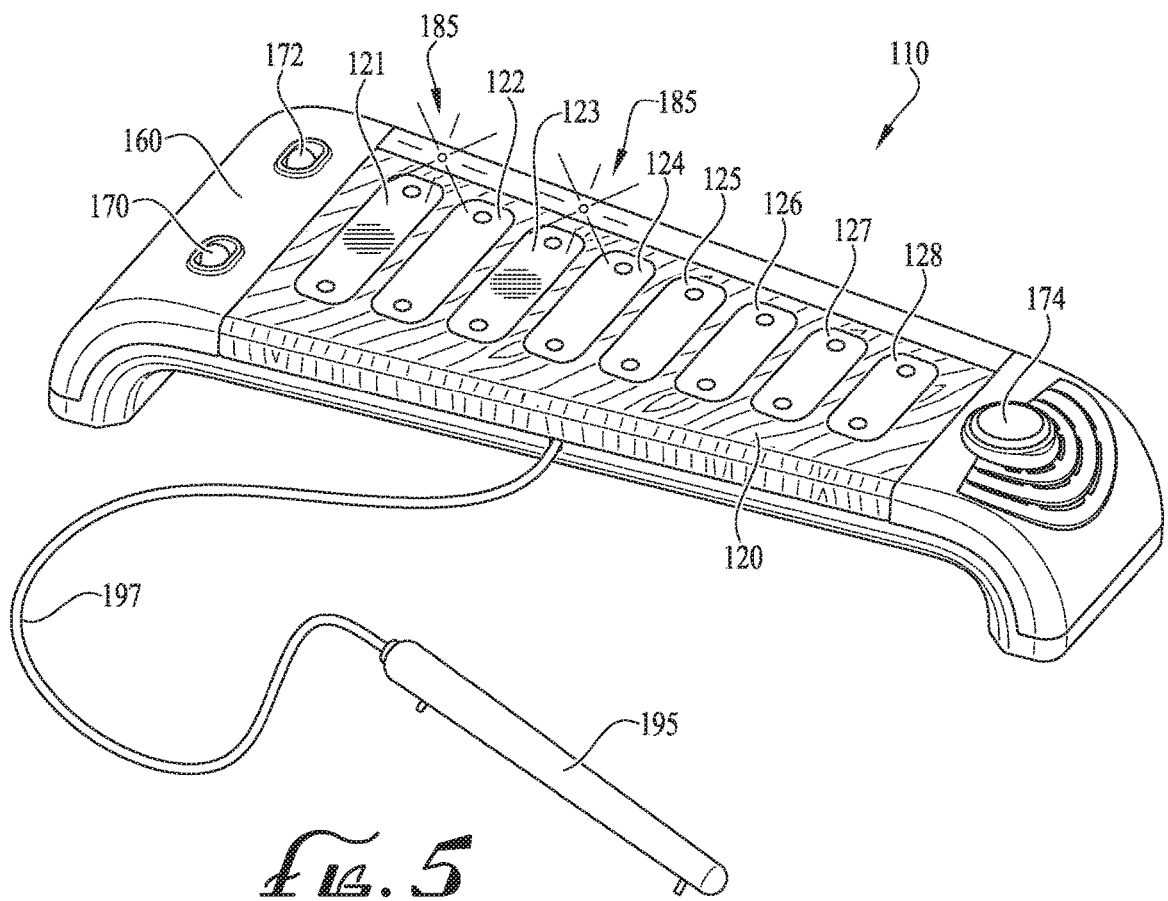
FIG. 5 is a top perspective view of a children's xylophone toy with capacitive touch sensor user input features according to another example embodiment of the present disclosure.
Figure 6:
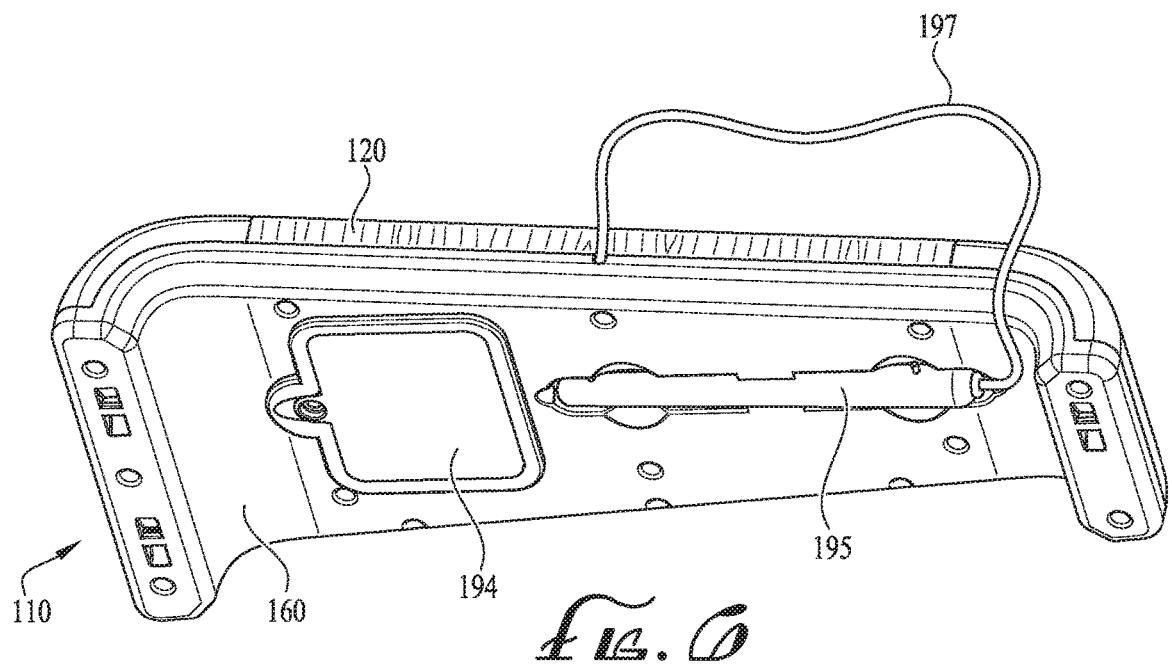
FIG. 6 is a bottom perspective view of the children's xylophone toy of FIG. 5.
Figure 9B:
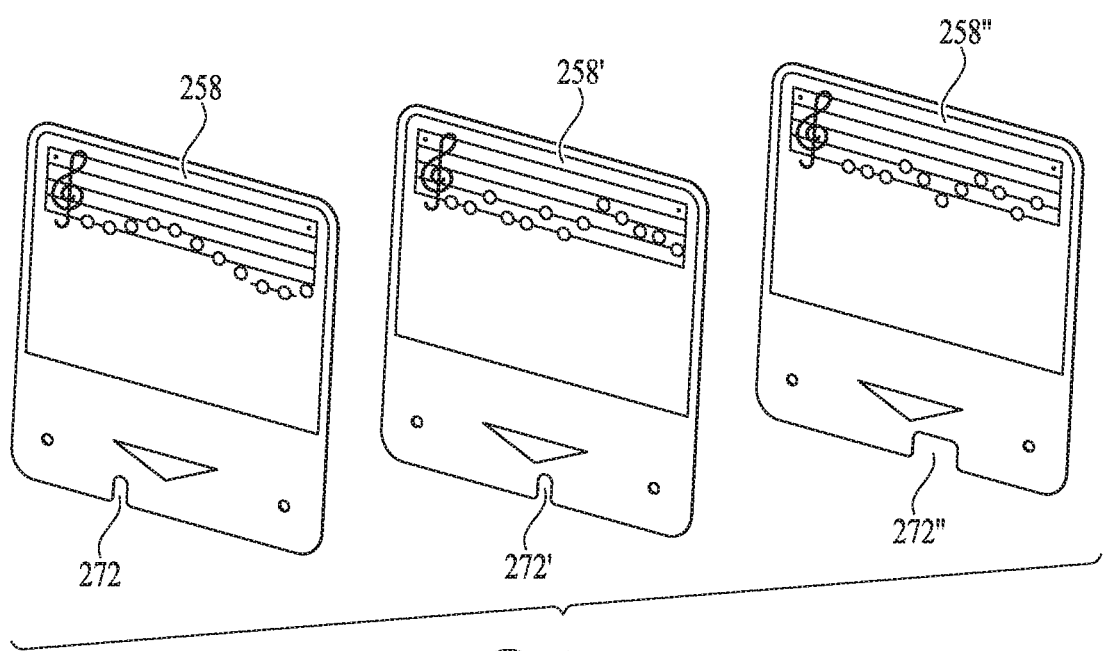
Figure 10:
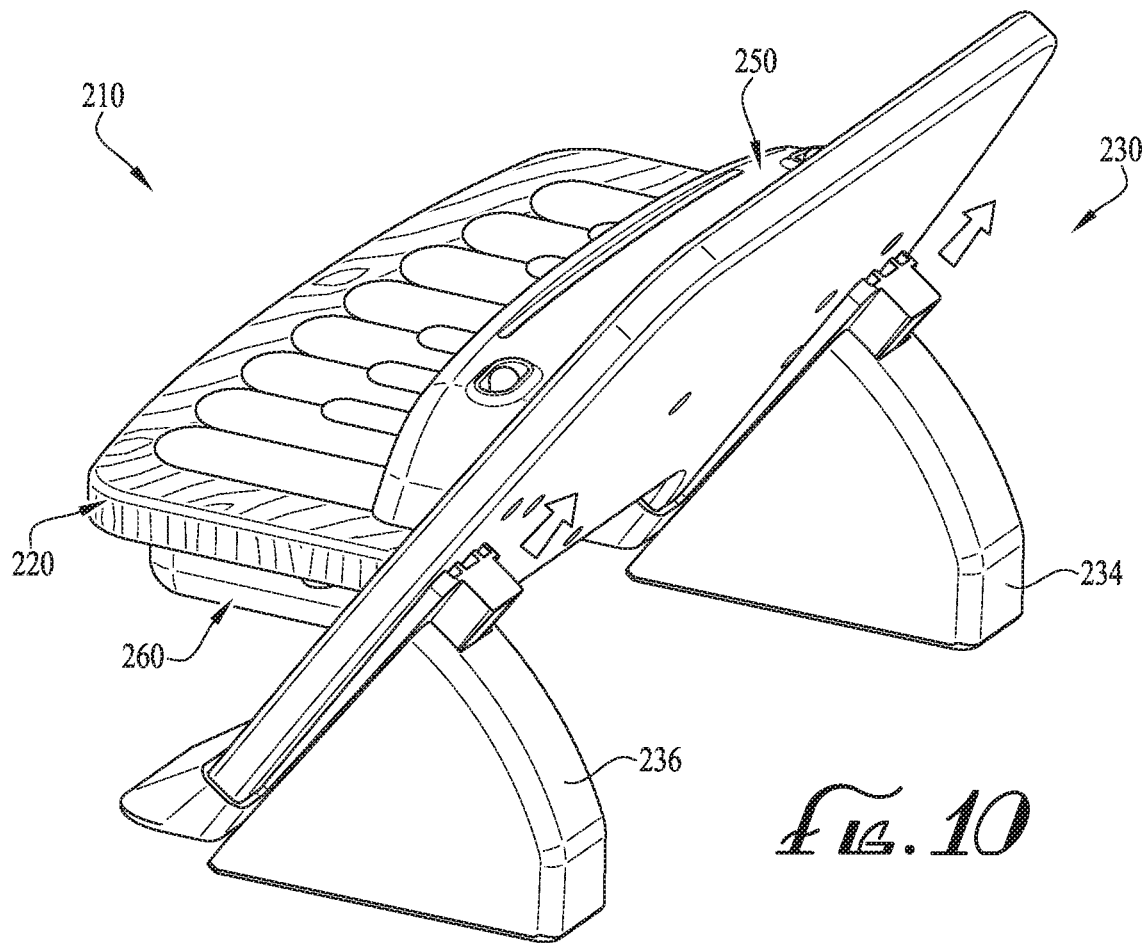
FIG. 10 is a back perspective view of the children's keyboard toy of FIG. 9.
Figure 11:
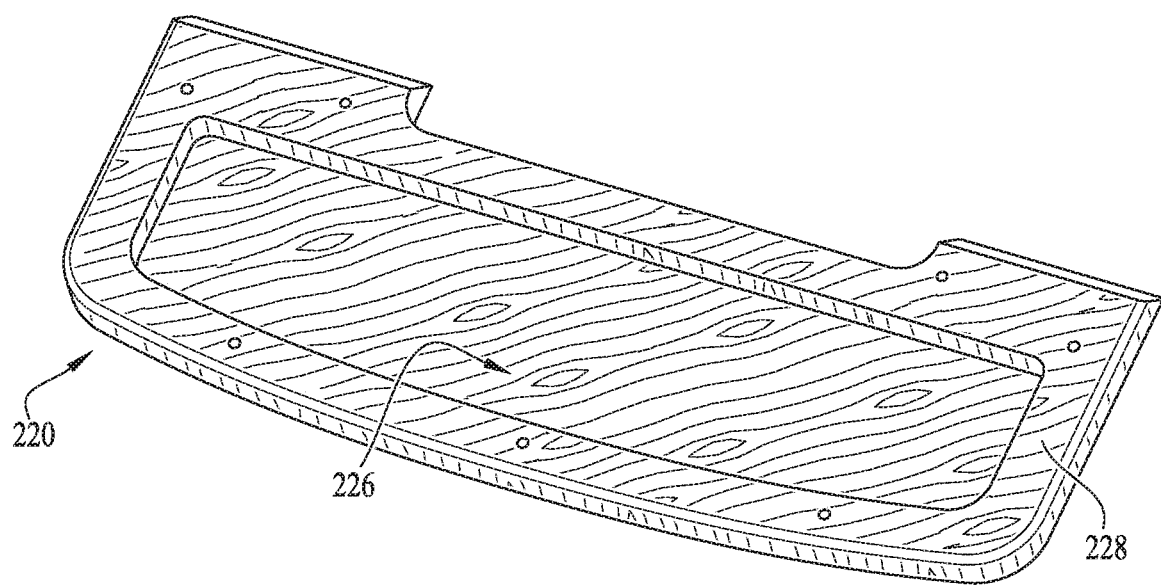
FIG. 11 is a bottom perspective view of the user-input overlay layer or cover panel of the children's keyboard toy of FIG. 9.

The present invention may be understood more readily by reference to the following detailed description of example embodiments taken in connection with the accompanying drawing figures, which form a part of this disclosure. It is to be understood that this invention is not limited to the specific devices, methods, conditions or parameters described and/or shown herein, and that the terminology used herein is for the purpose of describing particular embodiments by way of example only and is not intended to be limiting of the claimed invention. Any and all patents and other publications identified in this specification are incorporated by reference as though fully set forth herein.

Also, as used in the specification including the appended claims, the singular forms "a," "an," and "the" include the plural, and reference to a particular numerical value includes at least that particular value, unless the context clearly dictates otherwise. Ranges may be expressed herein as from "about" or "approximately" one particular value and/or to "about" or "approximately" another particular value. When such a range is expressed, another embodiment includes from the one particular value and/or to the other particular value. Similarly, when values are expressed as approximations, by use of the antecedent "about," it will be understood that the particular value forms another embodiment.

With reference now to the drawing figures, FIGS. 1-4 show an interactive children's toy drum 10 with capacitive touch user interface technology according to an example embodiment of the invention. The children's toy drum 10 generally includes a user interface cover layer or panel 20, a capacitive touch sensor system 40, a base or housing 60, and an electronic input-output control system 80. The user interface panel 20 comprises a top surface and an opposite bottom surface, with the top surface defining one or more user input surfaces or areas, such as user input areas 22, 24, 26, 28 in the depicted embodiment. In alternate embodiments, one, two, three, four or more user input areas may be provided. The user input areas 22, 24, 26, 28 are optionally configured to simulate the appearance of drum heads, and are optionally defined and indicated by one or more patterns, images, characters, text, delineations, or other markings, such as the animal characters within circular boundary markings shown in the depicted embodiment. The markings of the user input areas 22, 24, 26, 28 may be applied to the surface of the user interface panel 20, for example, by painting, stain, decals, inlay, or other visually and/or tactilely perceptible manner. In the depicted embodiment, the user interface panel 20 comprises an integral and unitary generally trapezoidal array of the four generally circular user input areas 22, 24, 26, 28 with continuous interconnecting webs of material extending seamlessly therebetween, with the outer user input areas 22, 28 extending at oblique angles (for example between about 30° to 45°, or about 40°) from the inner user input areas 24, 26.

In example embodiments, the user interface panel 20 comprises a smooth and continuous seamless exterior user input surface, without significant crevices or recesses in or around the user input areas, where dirt, food residue or other debris might collect, making it easier to clean the device, and preventing interference with internal electronics, switches or other components. In example embodiments, the user interface panel 20 comprises a unitary, integral component formed of a capacitive discharge conductive material, such as natural or synthetic wood, fabric, plastic, glass, or other material compatible with electronic capacitive touch sensor systems. In particular example embodiments, the user interface panel comprises a natural organic material such as wood or other plant-based materials. In the depicted example embodiment, the user interface panel 20 comprises a natural wood panel, such as a pine, maple, oak, beech, bamboo, Brazilian maple, walnut, mahogany, ash, birch, cherry, or other natural hardwood or softwood tree-based wood materials. In further embodiments, the user interface panel may comprise plywood, fiberboard, chipboard or other manufactured wood products. The user interface panel 20 preferably comprises a relatively thin material thickness in the user input areas 22, 24, 26, 28 for improved capacitive touch sensitivity, and optionally further comprises a relatively thicker material thickness in one or more surrounding or peripheral areas outside of the user input areas for improved durability and structural strength. For example, in the depicted embodiment, the user interface panel 20 comprises a hollowed-out or recessed inner region 32 underneath the user input areas 22, 24, 26, 28, leaving a thin cover layer of wood defining the user input areas, and a thicker peripheral rim 34 about the outer edge of the user interface panel. In alternate embodiments, a thin wood veneer or other capacitive discharge conductive material forms the user input areas. In the depicted embodiment, as seen best in FIG. 2, the hollowed out or recessed inner region 32 comprises a continuous recess including four interconnected generally circular recesses or chambers positioned beneath each of the user input areas 22, 24, 26, 28, with connecting webs therebetween. In alternate embodiments, one or more separate recesses or chambers may be provided. In example embodiments, the overall thickness of the user interface panel 20 in the relatively thicker peripheral area(s) 34 is between about 6 mm-to about 50 mm, more preferably about 10 mm to about 25 mm, for example about 12 mm or about 18 mm thick. In example embodiments, the material thickness of the user interface panel 20 in the relatively thinner user input areas 22, 24, 26, 28 is between about 1 mm to about 10-15 mm, for example between about 1 mm to 5 mm, more preferably about 2 mm-4 mm, for example about 2.5 mm or about 3 mm thick. Optionally, one or more openings 36 are formed through the user interface panel 20 in locations corresponding to output features such as audio speakers, lights, actuators, etc., or corresponding to input features such as mechanical switches, buttons, actuators, etc.

The user interface panel 20 overlies the base or housing 60, with the capacitive touch sensor system 40 sandwiched between the bottom surface of the user interface panel and the top surface of the base. The capacitive touch sensor system 40 comprises one or more capacitive touch sensors in operative contact with the bottom surface of the user interface panel 20, such as the depicted array of four sensors 42, 44, 46, 48. In example embodiments, the capacitive touch sensors 42, 44, 46, 48 each comprise an electrically conductive material such as, for example a copper or other metallic foil, sheet, strip, panel, button, or other configuration, and are connected by wires or other electrical conductors to the electronic input-output control system 80. In the depicted embodiment, each of the capacitive touch sensors 42, 44, 46, 48 comprises a lattice of conductive foil strips including a central longitudinal strip and three generally perpendicular transverse strips crossing the central strip, all surrounded by a generally circular circumferential strip. In alternate embodiments, the capacitive touch sensor system 40 may comprise one, two, three, four or more capacitive touch sensors of varying sensor configuration(s). In the depicted embodiment, the capacitive touch sensors 42, 44, 46, 48 are arranged in a generally trapezoidal array substantially conforming to the shape of the user interface panel 20, with each capacitive touch sensor positioned for alignment with a respective cooperating one of the user input areas 22, 24, 26, 28 when the toy 10 is assembled.

In example embodiments, the base or housing 60 comprises a plastic panel or molding, for example having an upper shell and a lower shell configured for assembly together to define an internal housing chamber 62 therein. The housing 60 includes an upper support surface 64, upon which the capacitive touch sensors 42, 44, 46, 48 are affixed, for example by adhesive, fasteners, or other attachment means. The housing 60 optionally also incorporates a carrying handle 66 for use in moving or carrying the toy 10, and/or for supporting the toy in a desired position for use. The housing 60 optionally also includes a control panel portion 70, having one or more openings formed therein and/or one or more actuators mounted thereto for interfacing with one or more input and/or output components of the electronic input-output control system 80. In the depicted embodiment, the base or housing 60 comprises a generally trapezoidal body incorporating four interconnected generally circular portions positioned for alignment with a respective cooperating one of the user input areas 22, 24, 26, 28 of the user interface panel 20 when the toy 10 is assembled, with connecting webs between the generally circular portions, and with the control panel portion extending in a proximal direction from a medial or interior region of the body. In alternate embodiments, the base or housing may take any of a variety of shapes, sizes and/or configurations to suit the intended product configuration. Optionally, a channel or groove 72 is formed in the housing 60, configured to accommodate a corresponding portion of the peripheral rim 34 of the user interface panel upon assembly. One or more output openings, such as speaker openings 74 may optionally also be provided through the housing 60, configured to align with corresponding output features of the electronic input-output control system 80, for example at or near the center of the housing or otherwise positioned thereon.

The electronic input-output control system 80 is preferably mounted in or on the base or housing 60. In example embodiments, the input-output system 80 comprises one or more integrated circuits (ICs) 82, 84 such as application specific integrated circuits (ASICs) incorporating onboard microprocessor(s), digital memory, and application software, for carrying out capacitive user input touch sensing, interactive voice/melody output, light output, and/or other input/output features of the toy 10. Example IC components of the input-output control system 80 include, without limitation, any IC with embedded touch feature, such as for example, Nyqest NY9T series, Sonix SNC86 series, General Plus GPCD9T or GPCD9TC series integrated circuits, a voice IC, and/or an audio or sound processor. In example embodiments, the capacitive touch ("cap-touch") functionality can optionally be provided by an integrated cap-touch and sound processor IC, or by a dedicated cap-touch controller IC, for example using a single printed circuit board (PCB), copper foil, carbon, and/or other conductive components and/or material(s), etc. The electronic input-output control system 80 optionally comprises one or more printed circuit boards 86 carrying the IC(s) and associated electronic components, and providing electrically conductive connections with the capacitive touch sensors 42, 44, 46, 48, and other input devices 90 such as on-off switches, mode switches, input sensors, volume controls, enhanced RAM memory, and optionally also a wireless connectivity module (Bluetooth/WiFi/near-field communication), etc., and with output devices 92 such as one or more speakers, lights, displays, vibration transducers, etc. Optionally, the IC or processor can provide light, sound, motorized activation, magnetic activation, camera, microphone, recording, projection, etc. features in response to receiving a capacitive touch (cap-touch) signal based on user input.

In example modes of use of the drum toy 10, a child or other user contacts the user input areas 22, 24, 26, 28 of the user interface panel 20 with their hands or with a conductive implement such as a conductive drumstick or mallet, for example comprising a conductive carbon (e.g., about 30%) impregnated high-density polyethylene (HDPE) material. The capacitive touch sensors 42, 44, 46, 48 beneath the user input areas 22, 24, 26, 28 sense the change in capacitance resulting from user contact with the wood or other capacitive discharge conductive material, and provide an electronic input signal to the capacitive touch IC 84 indicating a user contact input, which in turn signals the sound output IC 82 to output a sound signal to play a sound on the speaker 92. In example embodiments, user contact with each of the capacitive touch sensors 42, 44, 46, 48 generates a different sound output, for example, a base drum sound output, a snare drum sound output, a tom drum sound output, a cymbal sound output, etc. Optionally, the capacitive touch sensor system 40 senses the force or level of the contact as well as the contact itself, and the electronic input-output control system 80 generates sound outputs of varying volume, pitch or intensity corresponding to the input level. In further embodiments, the electronic input-output control system 80 optionally generates one or more melodies for the user to drum along with, and/or generates example drum beat patterns for the user to follow or play along with, or simply overlay drum or other instrument sounds on top of a playing melody.

FIGS. 5-8 show an interactive children's toy xylophone 110 according to another example embodiment of the invention. The children's toy xylophone 110 generally includes a user interface cover layer or panel 120, a capacitive touch sensor system 140, a base or housing 160 (comprising upper and lower half-shells 160, 160B), and an electronic input-output control system 180, in similar fashion to the above-described embodiment. The children's toy xylophone 110 optionally further comprises a mallet 195, for example comprising a conductive carbon (e.g., about 30%) impregnated high-density polyethylene (HDPE) material, which may be tethered to the base 160 by a cord 197.

In example embodiments, the user interface panel 120 comprises a smooth and continuous seamless exterior user input surface, without significant crevices or recesses in or around the user input areas, where dirt, food residue or other debris might collect. In substantially similar fashion to the above-described embodiment, the user interface panel 120 may comprise a unitary, integral component formed of a capacitive discharge conductive material, such as natural or synthetic wood, fabric, plastic, glass, or other material compatible with electronic capacitive touch sensor systems. In particular example embodiments, the user interface panel comprises a natural organic material such as wood or other plant-based materials. In the depicted example embodiment, the user interface panel 120 comprises a natural wood panel. The user interface panel 120 comprises a plurality of user input surfaces or areas, such as user input keys 121, 122, 123, 124, 125, 126, 127, and 128. The user input areas 121, 122, 123, 124, 125, 126, 127, 128 may be defined and indicated by painting, stain, decals, inlay, or other visually and/or tactilely perceptible manner. In example embodiments, the user input areas 121, 122, 123, 124, 125, 126, 127, 128 are marked by a plurality of different colors.

The user interface panel 120 preferably comprises a relatively thin material thickness in the user input areas 121, 122, 123, 124, 125, 126, 127, 128 for improved capacitive touch sensitivity, and optionally further comprises a relatively thicker material thickness in one or more surrounding or peripheral areas outside of the user input areas for improved durability and structural strength. For example, and as seen with reference to FIG. 8, in the depicted embodiment the user interface panel 120 comprises a hollowed-out or recessed inner region 132 underneath the user input areas, leaving a thin cover layer of wood defining the user input areas, and a thicker peripheral rim 134 about the outer edge of the user interface panel. In alternate embodiments, a thin wood veneer or other capacitive discharge conductive material forms the user input areas. In example embodiments, the overall thickness of the user interface panel 120 in the relatively thicker peripheral area(s) 134 is between about 6 mm-to about 50 mm, more preferably about 10 mm to about 25 mm, for example about 12 mm or about 18 mm thick. In example embodiments, the material thickness of the user interface panel 120 in the relatively thinner user input areas 121, 122, 123, 124, 125, 126, 127, 128 is between about 1 mm to about 5 mm, more preferably about 2 mm-4 mm, for example about 2.5 mm or about 3 mm thick. In example embodiments, the upper surface of the user interface panel 120 defines a generally trapezoidal profile, wider at one end and narrower at the other end, and having a length of about two times or more the width at the wider end. In example embodiments, the user input keys 121, 122, 123, 124, 125, 126, 127, 128 extend in a spaced array along the lengthwise direction, and are longer in their transverse dimension toward the wider end of the user interface panel 120 and become progressively shorter toward the narrower end of the user interface panel in a pattern generally matching the taper of the user interface panel.

The capacitive touch sensor system 140 is mounted between the base 160 and the user interface panel 120, and comprises a plurality of capacitive touch sensors 141, 142, 143, 144, 145, 146, 147, 148, corresponding to and aligned beneath the user input keys 121, 122, 123, 124, 125, 126, 127, 128, respectively. In example embodiments, the capacitive touch sensors 141, 142, 143, 144, 145, 146, 147, 148 each comprise an electrically conductive material such as, for example a conductive core, such as a conductive copper or conductive carbon mixed with high-density polyethylene (HDPE) or polyoxymethylene (POM), optionally overmolded with a thermoplastic rubber (TPR); and/or a copper or other metallic foil, sheet, strip, panel, button, or other configuration, and are connected by wires or other electrical conductors to the electronic input-output control system 180.

In example embodiments, the base or housing 160 comprises a plastic molding including an upper shell 160A and a lower shell 160B configured for assembly together to define an internal housing chamber 162 therein. The base 160 optionally further includes one or more manual inputs such as switches 170, 172, 174 in electronic communication with the electronic input-output control system 180, for selective user control of power on/off, volume control, mode switching, melody activation, and/or other features. The base 160 optionally further includes one or more output features in electronic communication with the electronic input-output control system 180, such as an audio speaker 192, lights, vibration transducers, and/or other outputs. The base 160 optionally further includes a battery compartment 194 for DC batteries to power the toy; and/or an AC power adaptor and electrical cord connection.

The electronic input-output control system 180 is preferably mounted in or on the base or housing 160. In example embodiments, the input-output system 180 comprises one or more integrated circuits (ICs), one or more printed circuit boards, and associated electronic components, in like manner as the above-described embodiment. In example embodiments, one or more light-emitting diode (LED) or other light sources 185 are provided in connection with the electronic input-output control system 180, for example positioned alongside the user input keys 121, 122, 123, 124, 125, 126, 127, 128 to illuminate in coordination with the sound output, for example in response to user input upon contact with the respective user input keys.

In example modes of use of the xylophone toy 110, a child or other user contacts the user input keys 121, 122, 123, 124, 125, 126, 127, 128 of the user interface panel 120 with their hands or with the conductive mallet 195. The capacitive touch sensors 141, 142, 143, 144, 145, 146, 147, 148 beneath the user input keys sense a change in capacitance through the thin portions of the wood user interface panel 120 upon user contact, providing an electronic input signal to the electronic input-output control system 180, which in turn outputs a sound signal to play a sound on the speaker 192 and/or to illuminate one or more corresponding LED lights 185. In example embodiments, user contact with each of the user input keys 121, 122, 123, 124, 125, 126, 127, 128 generates a different sound output, for example, a different musical note of an octave. Optionally, the capacitive touch sensor system 140 senses the force or level of the contact as well as the contact itself, and the electronic input-output control system 180 generates sound outputs of varying volume, pitch or intensity corresponding to the input level. In further embodiments, the electronic input-output control system 180 optionally generates one or more melodies for the user to play along with, and/or generates example melodies for the user to follow or play along with. In further example embodiments, a capacitive touch xylophone featuring indicating LEDs above each capacitive touch key can sequentially illuminate specific keys for the user to touch one-after-the-other, allowing the playback of a meaningful melodic sequence, note-by-note. In further embodiments, the system optionally also includes wireless connectivity peripherals, access to the personal cloud or open cloud for other services, social media inputs, etc. In example embodiments, the user input and output features may be located near to the electronic input-output control system 180.

FIGS. 9-13 show an interactive children's toy piano 210 according to another example embodiment of the invention. The children's toy piano 210 generally includes a user interface panel 220, a support structure 230, a capacitive touch sensor system 240, a control panel 250, a component housing 260, and an electronic input-output control system 280. The support structure 230 comprises an upright panel 232, and first and second support feet 234, 236. In example embodiments, the support feet 234, 236 have a wedge-shaped profile defining an angle of between about 30° to about 90°, more preferably about 50° to about 60°, and support the upright panel 232 at a corresponding angular position relative to a horizontal support surface. In example embodiments, the support feet 234, 236 comprise plastic moldings, and the upright panel 232 comprises a wood panel such as for example a 1 cm thick plywood panel.

In example embodiments, the user interface panel 220 comprises a smooth and continuous seamless exterior user input surface, without significant crevices or recesses in or around the user input areas, where dirt, food residue or other debris might collect. In substantially similar fashion to the above-described embodiments, the user interface panel 220 may comprise a unitary, integral component formed of a capacitive discharge conductive material, such as natural or synthetic wood, fabric, plastic, glass, or other material compatible with electronic capacitive touch sensor systems. In particular example embodiments, the user interface panel comprises a natural organic material such as wood or other plant-based materials. In the depicted example embodiment, the user interface panel 220 comprises a natural wood panel, such as for example a 1 cm thick plywood panel. The user interface panel 220 comprises a plurality of user input areas, such as user input keys 222, in a pattern generally corresponding to at least a portion of a piano keyboard and configured to simulate the appearance of piano keys, for example including keys for musical notes C, C #, D, D #, E, F, F #, G, G #, A, A #, B and C'. The user input keys 222 may be defined and indicated by painting, stain, decals, inlay, or other visually and/or tactilely perceptible manner. In example embodiments, the user input keys 222 are marked by a plurality of different colors, for example with corresponding musical notes of different octaves (C, C') in like colors.

The user interface panel 220 preferably comprises a relatively thin material thickness in the user input areas 222 for improved capacitive touch sensitivity, and optionally further comprises a relatively thicker material thickness in one or more surrounding or peripheral areas outside of the user input areas for improved durability and structural strength. For example, and as seen with reference to FIG. 11, in the depicted embodiment the user interface panel 220 comprises a hollowed-out or recessed inner region 226 underneath the user input areas, leaving a thin cover layer of wood defining the user input areas, and a thicker peripheral rim 228 about the outer edge of the user interface panel. In alternate embodiments, a thin wood veneer or other capacitive discharge conductive material forms the user input areas. In example embodiments, the overall thickness of the user interface panel 220 in the relatively thicker peripheral area(s) 228 is between about 6 mm-to about 30 mm, more preferably about 8 mm to about 12 mm, for example about 10 mm thick. In example embodiments, the material thickness of the user interface panel 220 in the relatively thinner user input areas 222 overlying the hollowed out region 226 is between about 1 mm to about 5 mm, more preferably about 2 mm-4 mm, for example about 2.5 mm or about 3 mm thick.

The capacitive touch sensor system 240 is mounted between the component housing 260 and the user interface panel 220, and comprises a plurality of capacitive touch sensors 242, for example sensors 242C, 242D, 242E, 242F, 242G, 242A, 242B and 242C', corresponding to and aligned beneath the user input keys 222 of corresponding musical notes on the upper surface of the user interface panel 220, respectively. In example embodiments, the capacitive touch sensors 242 each comprise an electrically conductive material such as, for example a copper or other metallic foil, sheet, strip, panel, button, or other configuration, and are connected by wires or other electrical conductors to the electronic input-output control system 280.

In example embodiments, the control panel 250 is mounted between the top surface of the user interface panel 220 and the front surface of the upright panel 232, and optionally includes one or more manual inputs such as switches 252, 254 and 256 in electronic communication with the electronic input-output control system 280, for selective user control of power on/off, volume control, mode switching, melody activation, and/or other features. The control panel 250 optionally also includes a play slot or receiver 257 for receiving an active song card 258 selected from one or more interchangeable indexed song cards 258, 258', 258", to engage with cooperative indicators linked to the electronic input-output control system 280 (as described below) to generate a song, and a holder slot 259 for storing one or more inactive song cards 258' when not in active use.

In example embodiments, the component housing 260 is mounted between the bottom surface of the user interface panel 220 and the front surface of the upright panel 232, and comprises a plastic molding including an upper shell 260A and a lower shell 260B configured for assembly together to define an internal housing chamber 262 therein. The component housing 260 optionally includes a battery compartment 264 for housing one or more DC batteries and/or an AC power adaptor and electrical cord connection to power the toy, and an audio speaker 266 for outputting sound in response to user input and/or from the electronic input-output control system 280. The component housing 260 optionally also includes a plurality of mechanical indicator fingers 270 linked to switches coupled to the electronic input-output control system 280. Differently indexed indicator tabs or cut-outs 272, 272', 272" on the interchangeable song cards 258, 258', 258" interact with different finger(s) 270 when an active card 258 selected by the user is inserted into the play slot 257 of the control panel 250, actuating the switches to signal the electronic input-output control system 280 to play a song corresponding to the active card from the system's onboard digital memory. In example embodiments, the card sensing is accomplished with mechanical switches. In alternative embodiments, capacitive touch technology can optionally be utilized to sense and identify an active song card with an integrated capacitive circuit.

In example embodiments, the electronic input-output control system 280 is preferably mounted in or on the component housing 260. In example embodiments, the input-output system 280 comprises one or more integrated circuits (ICs), one or more printed circuit boards, and associated electronic components, in like manner as the above-described embodiments. In example modes of use of the piano toy 210, a child or other user contacts the user input keys 222 of the user interface panel 220 with their fingers. The capacitive touch sensors 242 beneath the user input keys sense a change of capacitance through the thin portions of the wood user interface panel 220 upon user contact, providing an electronic input signal to the electronic input-output control system 280, which in turn outputs a sound signal to play a sound on the speaker 266. In example embodiments, user contact with each of the user input keys 222 generates a different sound output, for example, a different musical note, corresponding to that key. Optionally, the capacitive touch sensor system 240 senses the force or level of the contact as well as the contact itself, and the electronic input-output control system 280 generates sound outputs of varying volume, pitch or intensity corresponding to the input level. In further embodiments, the electronic input-output control system 280 optionally generates one or more melodies for the user to play along with, and/or generates example melodies for the user to follow or play along with. For example, the user may select a song card 258 corresponding to a desired melody or song to be played. In further embodiments, the electronic input-output control system 280 optionally further comprises access to AI (artificial Intelligence agents via IoT (Internet of Things) devices and services.

FIGS. 14-15 show additional forms of interactive children's toys according to further example embodiments of the invention. The toy 310 of FIG. 14 includes a user interface panel 320 having five user input keys which operate in connection with internal capacitive touch sensors to generate sound or other output in response to user touch input in substantially similar fashion to the above described embodiments. Additional toy features such as movable elements 330 may be mounted to a handle 332 of the toy. Similarly, the toy 410 of FIGS. 15A-15C also includes a user interface panel 420 having user input keys which operate in connection with internal capacitive touch sensors to generate sound or other output in response to user touch input, and movable character elements 430 mounted to a handle 432 of the toy.

Figure 16A:
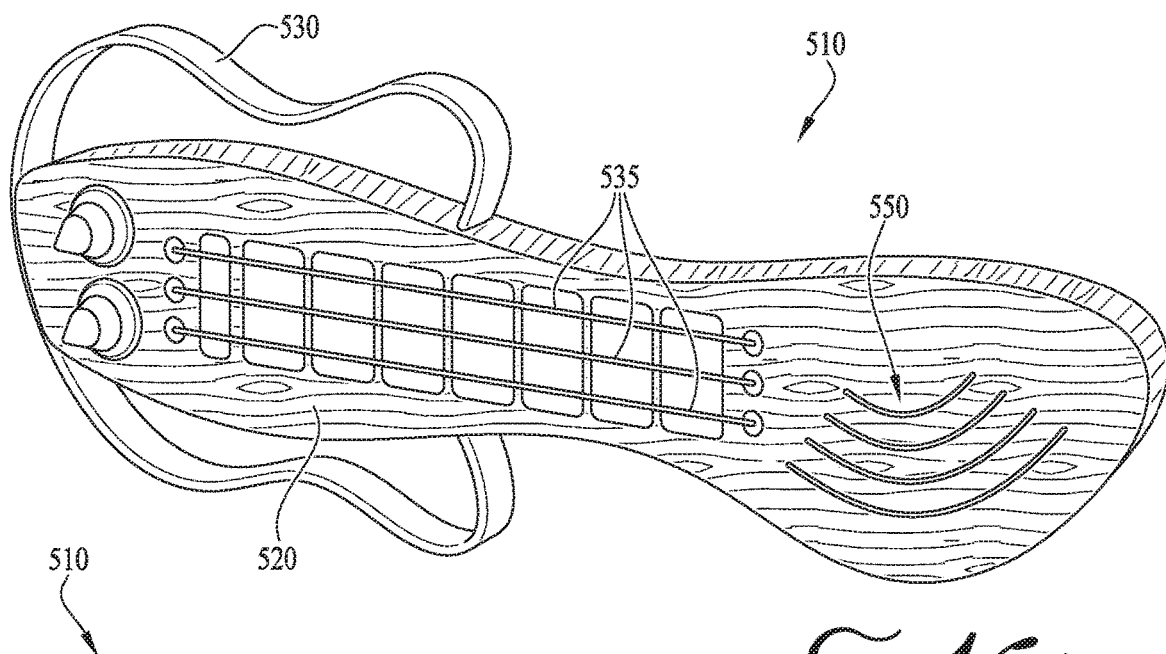
Figure 16B:
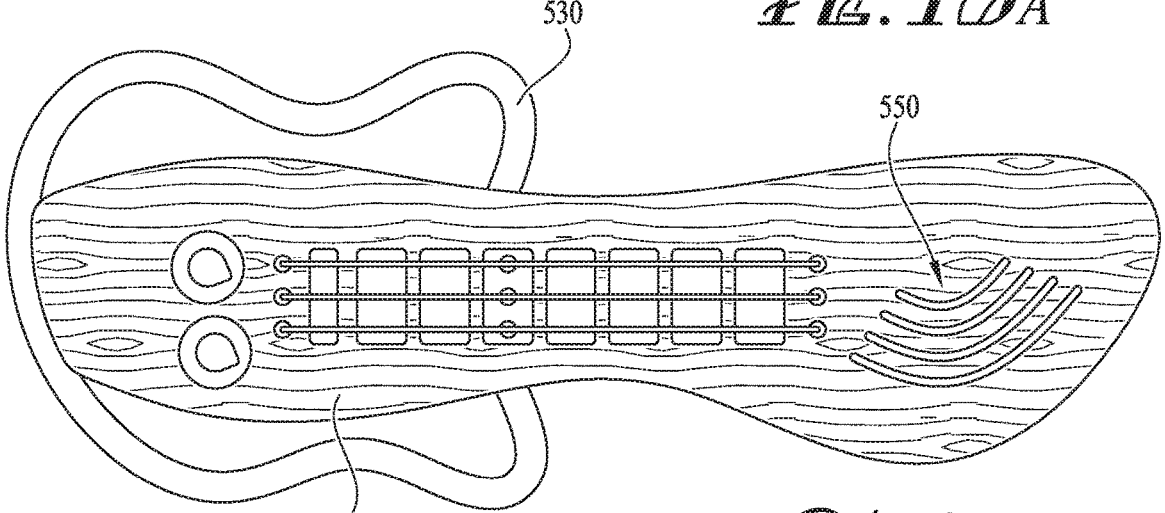
Figure 16C:
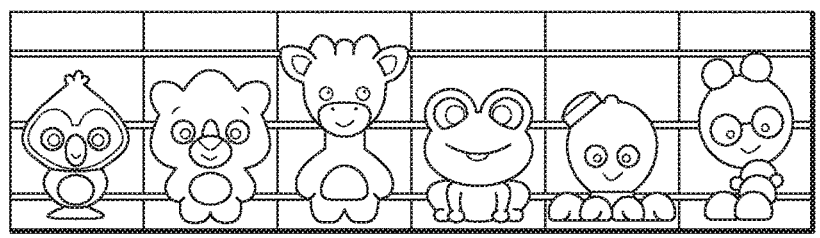

FIG. 16 shows an interactive children's toy guitar 510 according to another example embodiment of the invention. The guitar toy includes a user interface panel 520 in the shape of the guitar's neck and string area, and an outer body frame 530. Actual or simulated strings 535 extend along at least a portion of the user interface panel 520. Simulated frets 522 along the user interface panel define a plurality of user input areas. As shown in FIG. 16C, the simulated fret user inputs 522 may optionally include one or more characters 525 or other markings. Capacitive sensors mounted beneath the simulated fret user inputs 522 sense user touch input and generate sound output from an audio speaker 550, in similar fashion to the above-described embodiments. In example embodiments, one or more of the rectangular pads beneath the strings 535 comprise capacitive touch user interface surfaces, in operative communication with a capacitive sensor within the user interface panel 520 in similar fashion to the above described embodiments. In some embodiments, the strings 535 do not provide capacitive touch sensing in addition to the user interface surfaces. In alternate embodiments, the strings 535 optionally do provide separate or additional capacitive touch sensing.

Figure 18:
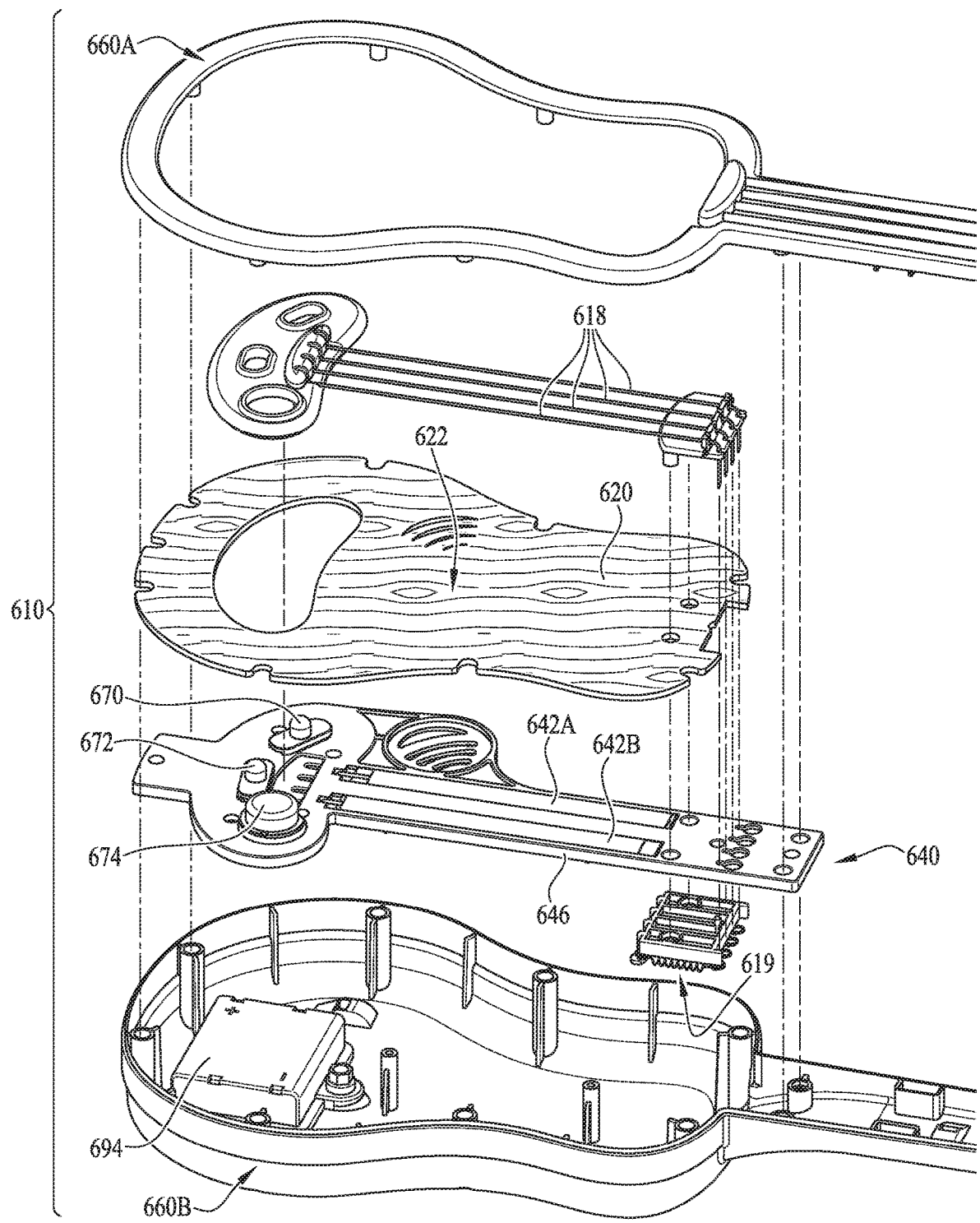
FIG. 18 is an assembly view of the children's ukulele or guitar toy of FIG. 17.
Figure 19:
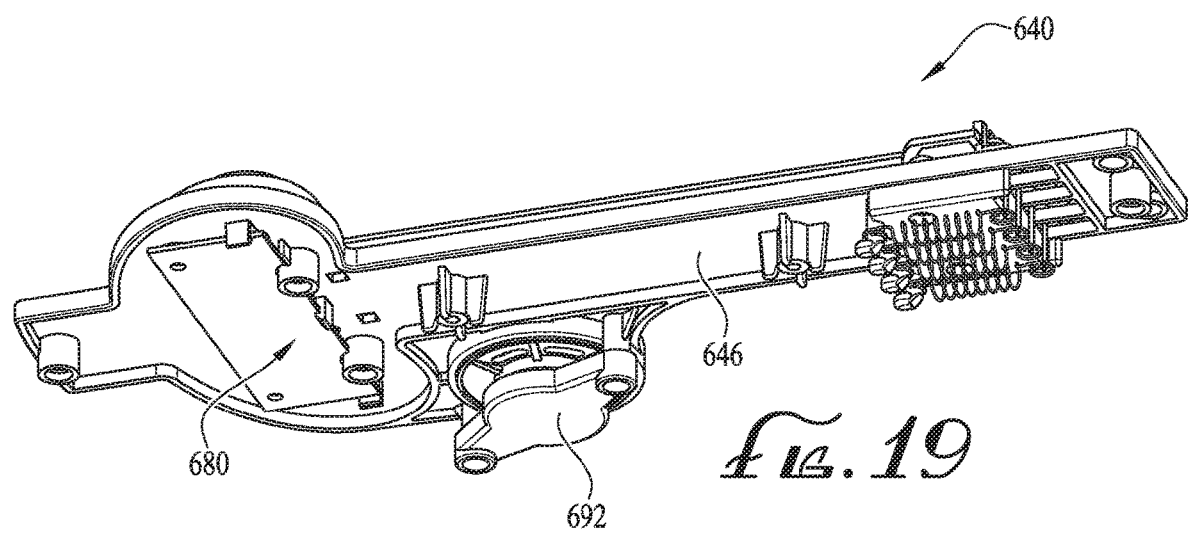
FIG. 19 is a lower perspective view of a capacitive touch sensor and base assembly portion of the children's ukulele or guitar toy of FIG. 17.
Figure 20:
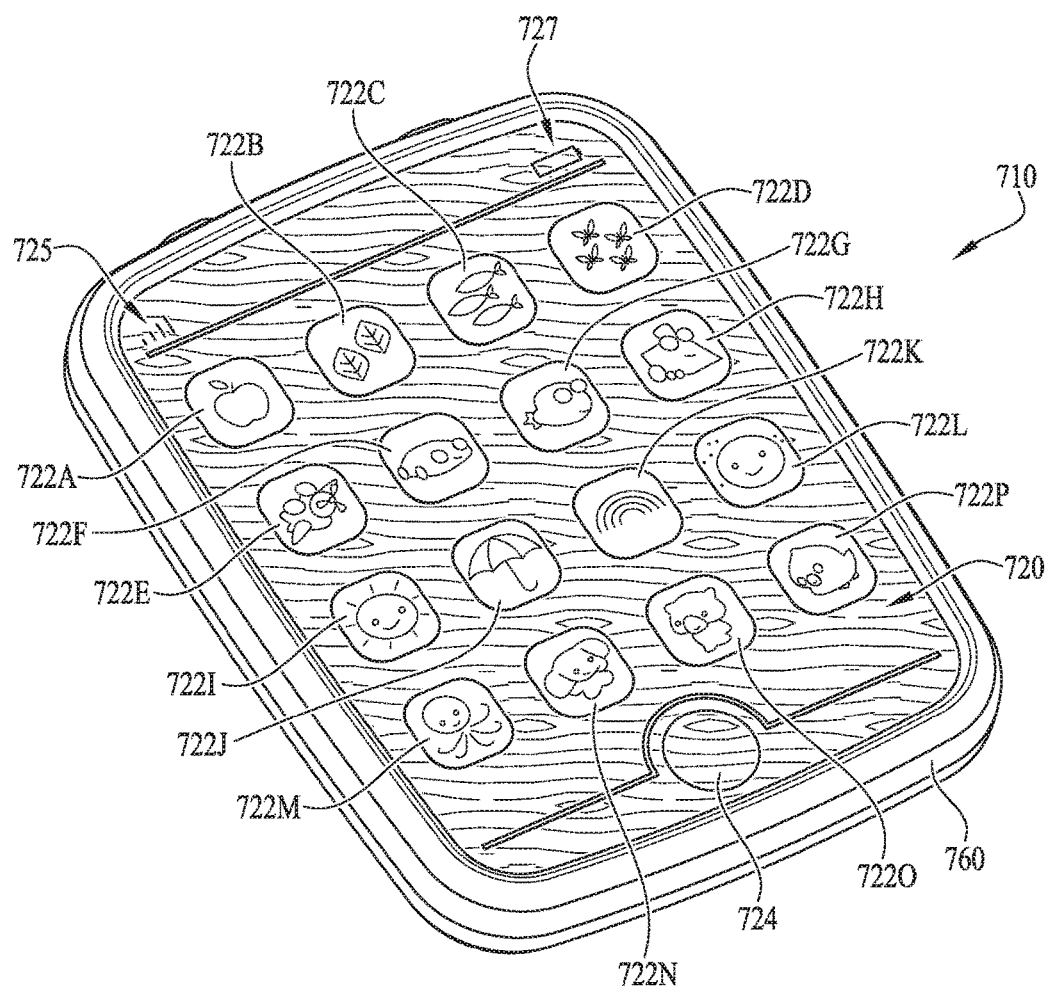
FIG. 20 is a top perspective view of a children's tablet toy with capacitive touch sensor user input features according to another example embodiment of the present disclosure.
Figure 21:
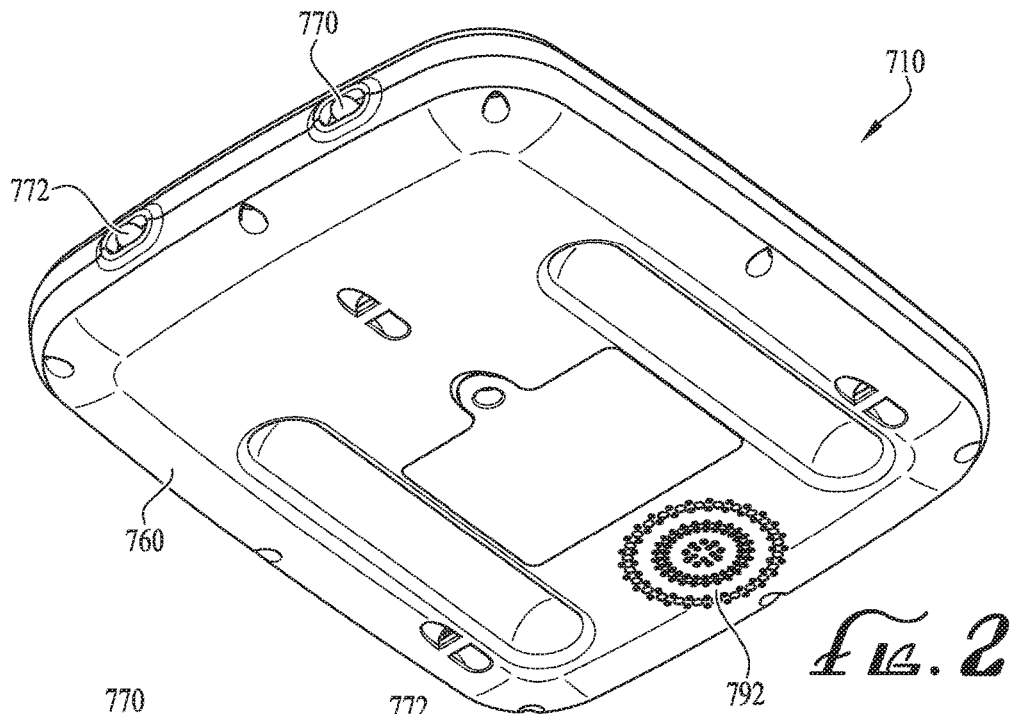
FIG. 21 is a bottom perspective view of the children's tablet toy of FIG. 20.
Figure 22:
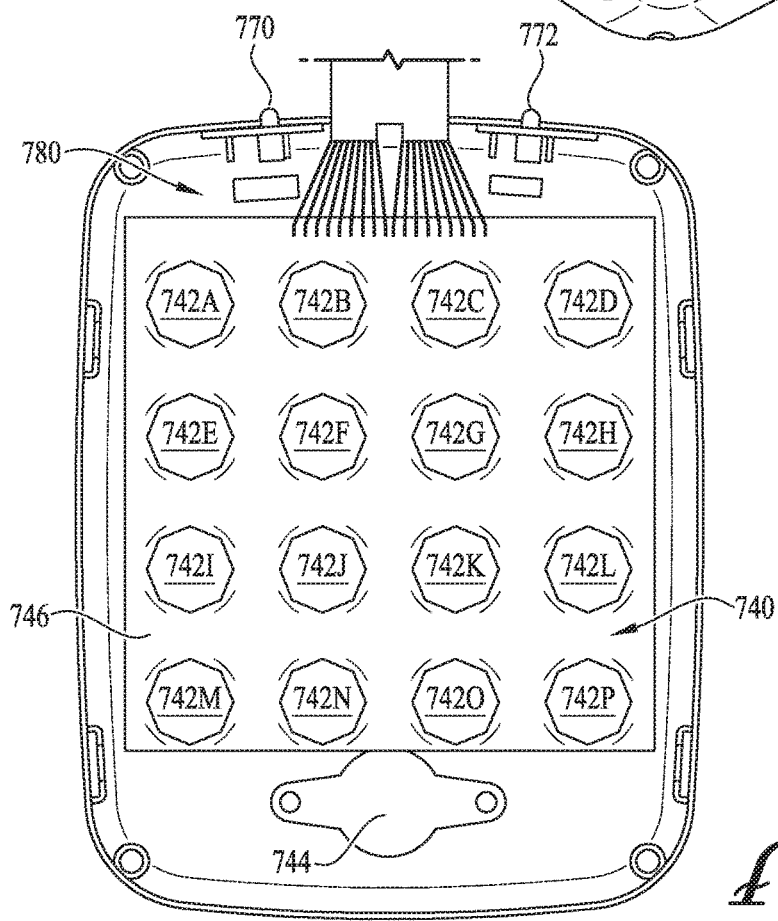
FIG. 22 shows a capacitive touch sensor and electronic circuit board assembly of the children's tablet toy of FIG. 20.
Figure 23:
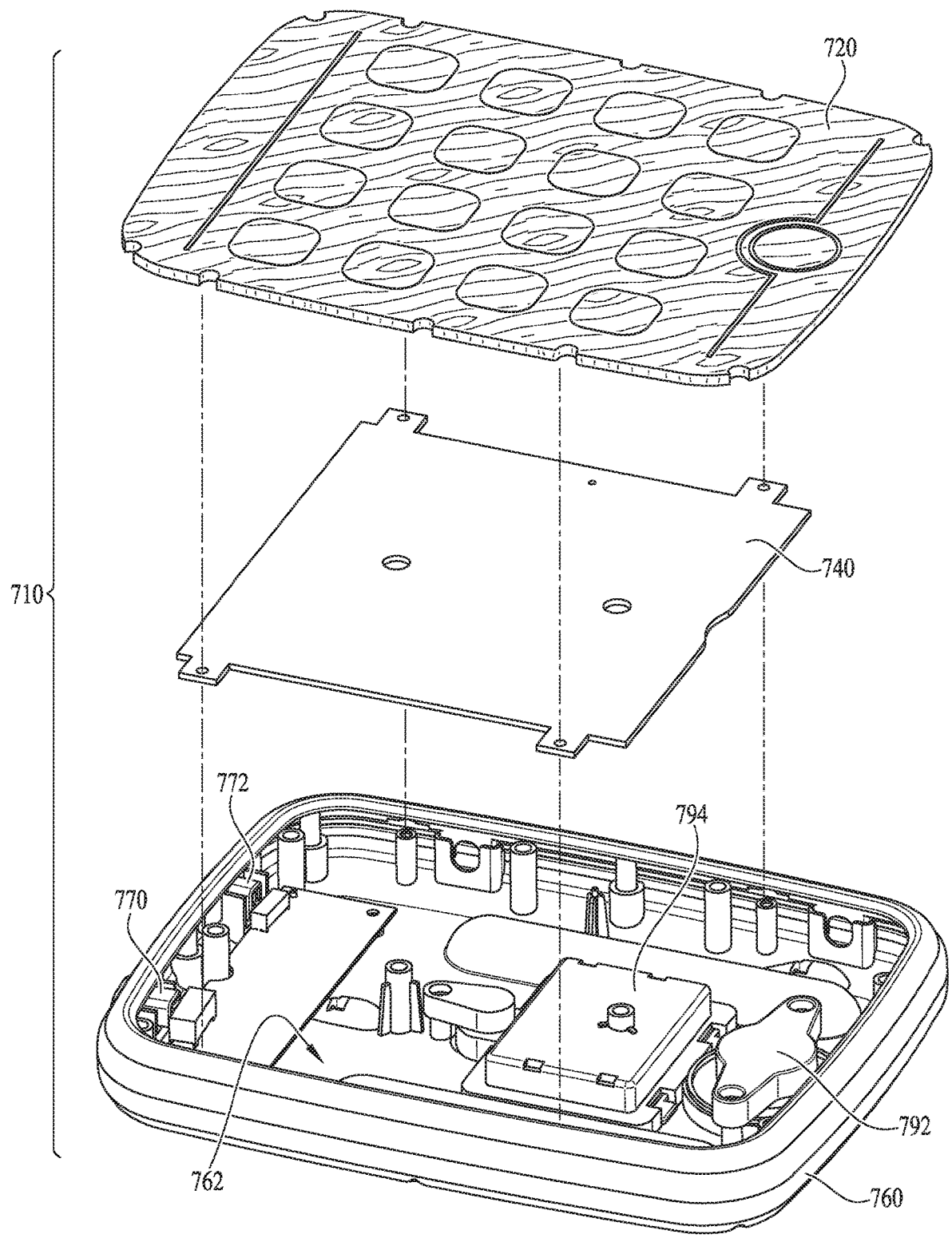
FIG. 23 is an assembly view of the children's tablet toy of FIG. 20.

FIGS. 17-19 show an interactive children's toy ukulele 610 according to another example embodiment of the invention. The ukulele toy 610 generally comprises a body section 612, a neck 614, a head 616, and a plurality of strings 618. The ukulele toy 610 further comprises a user interface cover layer or panel 620, a capacitive touch sensor system 640, a base or housing 660 (formed by an upper shell portion 660A and a lower shell portion 660B), and an electronic input-output control system 680. The user interface panel 620 comprises one or more user input surfaces or areas 622, 622' positioned beneath the strings 618 and/or along the neck 614 of the ukulele toy 610.

In example embodiments, the user interface panel 620 comprises a smooth and continuous seamless exterior user input surface, without significant crevices or recesses in or around the user input areas, where dirt, food residue or other debris might collect. In substantially similar fashion to the above-described embodiments, the user interface panel 620 may comprise a unitary, integral component formed of a capacitive discharge conductive material, such as natural or synthetic wood, fabric, plastic, glass, or other material compatible with electronic capacitive touch sensor systems. In particular example embodiments, the user interface panel comprises a natural organic material such as wood or other plant-based materials. In the depicted example embodiment, the user interface panel 620 comprises a natural wood panel, such as for example a wood veneer panel having a material thickness of between about 1 mm to about 5 mm, more preferably about 2 mm-4 mm, for example about 2.5 mm or about 3 mm thick. One or more openings are optionally provided through the user interface panel 620 aligned with input and/or output components such as an audio speaker and user input controls.

The capacitive touch sensor system 640 comprises one or more capacitive touch sensors 642A, 642B. In example embodiments, the capacitive touch sensors 642A, 642B comprise an electrically conductive material such as, for example a copper or other metallic foil, sheet, strip, panel, button, or other configuration, and are connected by wires or other electrical conductors to the electronic input-output control system 680. In the depicted example embodiment, the capacitive touch sensor system 640 comprises a plastic panel 646, upon which the capacitive touch sensors 642A, 642B and the strings 618 of the ukulele toy are mounted, with a capacitive touch sensor printed circuit board mounted in contact with the underside of the panel 646, and one or more metallic foil or other capacitive touch sensors corresponding to the user input areas 622 of the user interface panel 620.

The electronic input-output control system 680 may also be mounted on the panel 646. In example embodiments, the input-output system 680 comprises one or more integrated circuits (ICs), one or more printed circuit boards, and associated electronic components, in like manner as the above-described embodiments. One or more manual inputs such as switches 670, 672, 674 may be provided in electronic communication with the electronic input-output control system 680, for selective user control of power on/off, volume control, mode switching, melody activation, and/or other features. One or more output features may also be provided in electronic communication with the electronic input-output control system 680, such as an audio speaker 692, lights, vibration transducers, and/or other outputs. The housing 660 optionally further includes a battery compartment 694 for DC batteries to power the toy; and/or an AC power adaptor and electrical cord connection. In example embodiments, one or more springs 619 mounted to the panel 646 keep the strings 618 in tension.

In example modes of use of the ukulele toy 610, capacitive touch sensors under the wood surface detect the child's touch inputs. In a "Guided Play" Mode, the melodies are broken into short fragments (i.e. 1 measure) and sequential inputs to the capacitive touch sensors drive the melody playback fragment-by-fragment, measure-by-measure. Each fragment leads off with a powerful strum and the short duration of the sequences creates the illusion that the infant is playing the Ukulele in a meaningful way. Because any touch will interrupt the playing fragment and immediately play the next fragment in the sequence, the toy remains responsive throughout Guided Play. In a "Free Play" Mode, successive touch inputs sequentially play a defined sequence of strums that make musical sense, thus reducing cacophonous playback. If a melody is already playing, the capacitive touch inputs play a Ukulele chord that aligns with the current key of the playing melody at any given moment, again to reduce cacophony; overlay ukulele sounds are optionally dynamically pitched to match the underlying melody.

FIGS. 20-23 show an interactive children's toy tablet 710 according to another example embodiment of the invention. The tablet 710 generally comprises a user interface cover layer or panel 720, a capacitive touch sensor system 740, a base or housing 760, and an electronic input-output control system 780. The user interface panel 720 comprises one or more, and preferably a plurality of user input surfaces or areas 722A-722P, for example in the form of simulated buttons or icons. In example embodiments, each of the user input surfaces 722A-722P comprises a different character, image, symbol or other indicator. The user interface panel 720 optionally also includes a start button user input area 724 and other features such as a simulated signal strength indicator 725, a simulated battery strength indicator 727, and/or other features configured to present the appearance of an actual electronic computer tablet device. In example embodiments, the user interface panel 720 comprises a smooth and continuous seamless exterior user input surface, without significant crevices or recesses in or around the user input areas, where dirt, food residue or other debris might collect. In substantially similar fashion to the above-described embodiments, the user interface panel 720 may comprise a unitary, integral component formed of a capacitive discharge conductive material, such as natural or synthetic wood, fabric, plastic, glass, or other material compatible with electronic capacitive touch sensor systems. In particular example embodiments, the user interface panel comprises a natural organic material such as wood or other plant-based materials. In the depicted example embodiment, the user interface panel 720 comprises a natural wood panel, such as for example a wood veneer panel having a material thickness of between about 1 mm to about 5 mm, more preferably about 2 mm-4 mm, for example about 2.5 mm or about 3 mm thick.

The capacitive touch sensor system 740 comprises one or more, and preferably a plurality of capacitive touch sensors 742A-742P, corresponding to and aligned beneath respective user input surfaces 722A-722P. Optionally, an additional capacitive touch sensor 744 is provided, aligned beneath the start button user input area 724. In example embodiments, the capacitive touch sensors 742, 744 comprise an electrically conductive material such as, for example a copper or other metallic foil, sheet, strip, panel, button, or other configuration, and are connected by wires or other electrical conductors to the electronic input-output control system 780. In the depicted example embodiment, the capacitive touch sensor system 740 comprises a printed circuit board 746 incorporating the capacitive touch sensors 742, 744 and associated electronic components and capacitive touch sensor circuitry.

In example embodiments, the base or housing 760 comprises a plastic molding having an internal housing chamber 762 therein. The base 760 optionally further includes one or more manual inputs such as switches 770, 772 in electronic communication with the electronic input-output control system 780, for selective user control of power on/off, volume control, mode switching, language selection, melody activation, and/or other features. The base 760 optionally further includes one or more output features in electronic communication with the electronic input-output control system 780, such as an audio speaker 792, lights, vibration transducers, and/or other outputs. The base 760 optionally further includes a battery compartment 794 for DC batteries to power the toy; and/or an AC power adaptor and electrical cord connection.

The electronic input-output control system 780 is preferably mounted in or on the base or housing 760. In example embodiments, the input-output system 780 comprises one or more integrated circuits (ICs), one or more printed circuit boards, and associated electronic components, in like manner as the above-described embodiments. In example modes of use of the tablet toy 710, a child or other user contacts the user input icons 722 of the user interface panel 720 with their fingers or with a conductive stylus. The capacitive touch sensors 742 beneath the user input keys sense a change in capacitance through the thin portions of the wood user interface panel 720 upon user contact, providing an electronic input signal to the electronic input-output control system 780, which in turn outputs a sound or other output signal to play a voice or other sound on the speaker 792 and/or to activate one or more other output features. In example embodiments, user contact with each of the user input icons 722A-722P generates a different output. In further embodiments, the electronic input-output control system 780 optionally generates one or more queries or instructions to prompt the user to contact a specified user input icon 722, which in turn generates a predetermined response for interactive feedback with the user. For example, the system may prompt a user to touch the icon showing an apple, and upon sensing user input contact with the apple icon may generate a confirmatory response (or may generate a corrective response indicating an incorrect user input contact with a different icon). Alternatively or additionally, a user-directed mode of use may allow the user to contact any icon, and generate a system response identifying that particular icon or a characteristic associated with that icon.

Figure 24:
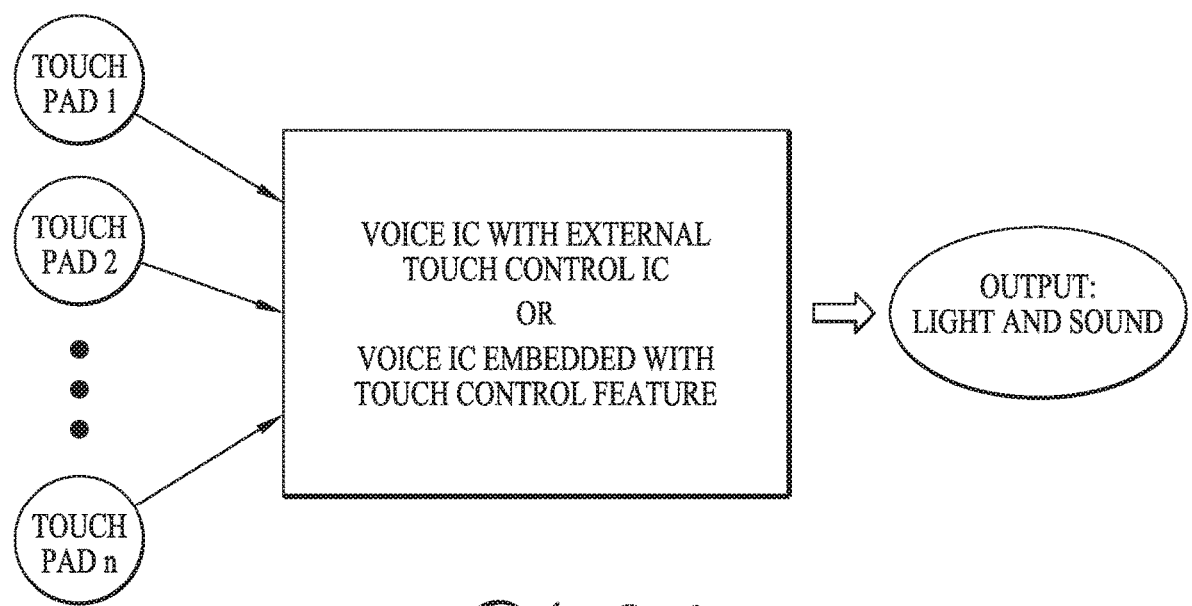
FIG. 24 is a schematic diagram showing user inputs, touch control and sound output integrated circuit electronic processors, and output feature(s) of a device or apparatus according to an example embodiment of the present disclosure.

FIG. 24 shows a block diagram of a user input system according to an example embodiment of the present disclosure. One or more user input points, such as touch pads 1-n provide user input to a touch control integrated circuit. In example embodiments, the touch control integrated circuit may be selected from, without limitation, any IC with embedded touch feature, such as for example, Nyqest NY9T series, Sonix SNC86 series, General Plus GPCD9T or GPCD9TC series integrated circuits, a voice IC, and/or an audio or sound processor. The touch control integrated circuit then signals a separate or integrated voice/melody integrated circuit or audio or sound processor to generate an output responsive to the particular user input received. The output optionally prompts additional input from the user for repeated interactive play, entertainment, and/or educational purposes. In example embodiments, the capacitive touch ("cap-touch") functionality can optionally be provided by an integrated cap-touch and sound processor IC, or by a dedicated cap-touch controller IC, for example using a single printed circuit board (PCB), copper foil, carbon, and/or other conductive components and/or material(s), etc. Optionally, the IC or processor can provide light, sound, motorized activation, magnetic activation, camera, microphone, recording, projection, etc. features in response to receiving a capacitive touch (cap-touch) signal based on user input.

Figure 25:
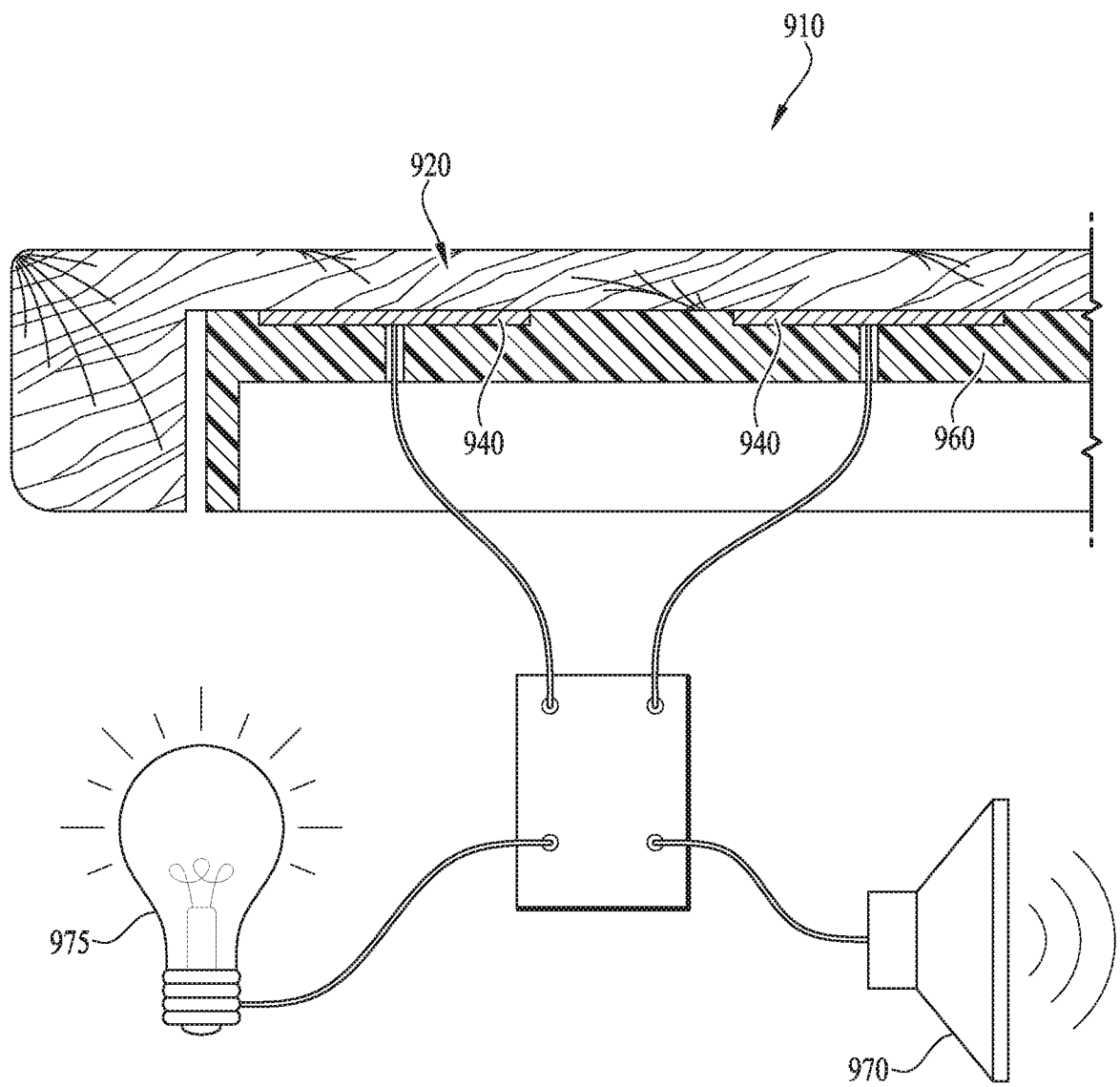
FIG. 25 is a partial cross-sectional view schematically showing a device or apparatus having a wood cover panel user input surface overlying capacitive touch input sensors, in electronic communication with an electronic processer coupled to output devices, according to an example embodiment of the present disclosure.
Figure 26A:
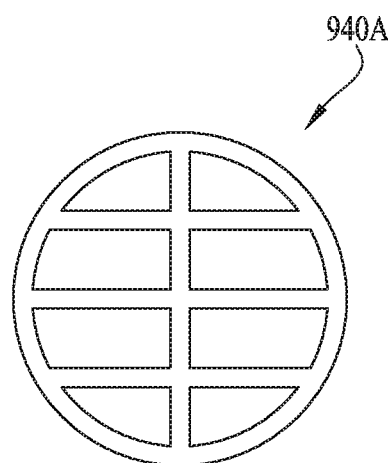
FIGS. 26A, 26B, 26C and 26D show different capacitive touch sensor formats according to example embodiments of the present disclosure.
Figure 26B:
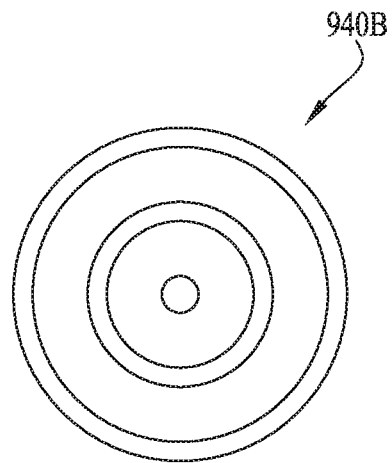
Figure 26C:
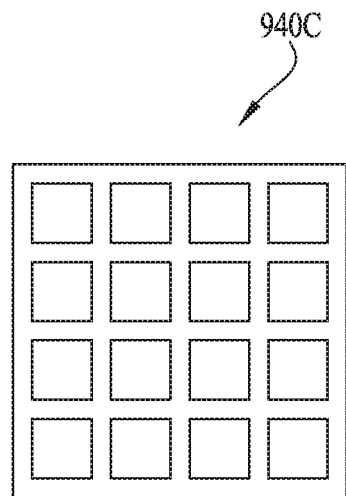
Figure 26D:
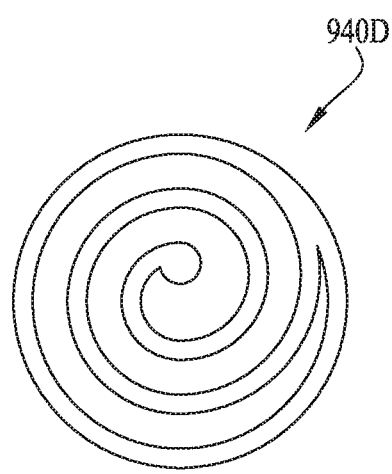

In various example embodiments, and with reference to the general schematic diagram of FIG. 25, a capacitive touch device 910 includes an overlay layer 920, a sensor layer 940 beneath the bottom surface of the overlay layer, and optionally a base 960 supporting the sensor layer. In alternate embodiments, the sensor layer may be integrated into the base. One or more of the overlay layer, sensor layer, and base layer can be manufactured from a flexible substrate, enabling the capacitive touch device to be installed in various arrangements tailored to the shape of the device in which the capacitive touch device 910 is implemented. In example embodiments, the overlay layer 920 is formed from a capacitive touch conductive organic material such as wood. The wood overlay layer can be shaped and ornamented to resemble a musical instrument or other device. The top surface of the overlay layer may receive a user input (e.g., a touch, swipe, or other contact). The user input can be made by contact with skin, such as a finger touch, or contact with an implement or tool of capacitive touch conductive material, such as a conductive silicone or acrylonitrile butadiene styrene (ABS). The top surface of the overlay layer can be painted or otherwise styled to indicate one or more user touch input areas. In example embodiments, the wood overlay layer material is moisture-controlled for neutral capacitance so as to not trigger the sensors unintentionally. The thickness of the wood overlay layer is selected to ensure the underlying sensor layer beneath the overlay layer will be triggered through the overlay layer upon user contact with the user touch input areas on the top surface of the overlay layer. In alternate embodiments, the overlay layer can include glass, plastic, or another capacitive touch conductive material, which has a rigidity sufficient to protect the underlying sensor layer from damage due to repeated use cycles. Alternatively or additionally, the overlay layer can comprise a natural or synthetic fabric covering, such as for example a cotton, canvas, wool, nylon or other woven or non-woven fabric or sheet material.

The sensor layer 940 includes one or more capacitive touch sensors, which generate a sensor signal based on and responsive to the user input. The sensor signal can optionally include an indication of a location at which the user input was received by the overlay layer. The sensor signal can correspond to a change in capacitance of the sensor layer (or electrical components thereof) resulting from the user input. The sensor layer can generate the sensor signal based on capacitive coupling between the object contacting the overlay layer and the sensor layer. The sensor layer can generate the sensor signal using surface capacitance or projected capacitance. The sensor layer can include a conductor which acts as a capacitive layer. Example conductors include copper foil, polychlorinated biphenyl (PCB), and indium tinoxide (ITO). In other embodiments, other conductors can be used. The sensor layer can include a plurality of capacitive layers (which may be separated by corresponding insulating layers). The capacitive sensors can be provided in a variety of configurations including linear, grid, spiral, or radial, as shown in example embodiments 940A-940D in FIGS. 26A-26D. The sensor layer may optionally comprise one or more compressible layers or strata, whereby user input pressing harder or further into the material is sensed and processed to generate different types or levels of system output responsive to the type or level of user input.

The base layer 960 serves as a mount for the sensor layer and the overlay layer. Generally, the sensor layer is mounted to a top surface of the base layer. The overlay layer is mounted to the base layer such that the bottom surface of the overlay layer contacts the sensor layer. The base layer can be formed of a conductive material such as a conductive plastic. Example conductive plastics include polyethylene and polypropylene. The base layer can also house one or more output devices such as a speaker or other audio device 970 that produces sound, and/or a light or other visually perceptible output device 975 based on inputs from the sensor layer. The base layer can also house a control circuit described below.

In example embodiments, the capacitive touch device includes an electronic control circuit or system 980. The control system 980 can include a processor and memory. The processor may be implemented as a specific purpose processor, an application specific integrated circuit (ASIC), one or more field programmable gate arrays (FPGAs), a group of processing components, or other suitable electronic processing components. The memory may comprise one or more devices (e.g., RAM, ROM, flash memory, hard disk storage) for storing data and computer software code for completing and facilitating the various user or client processes, layers, and modules described in the present disclosure. The memory may be or include volatile memory or non-volatile memory and may include database components, object code components, script components, or any other type of information structure for supporting the various activities and information structures of the inventive concepts disclosed herein. The memory is communicably connected to the processor and includes computer code or instruction modules for executing one or more processes described herein. The memory optionally includes various circuits, software engines, and/or modules that cause the processor to execute the systems and methods described herein, including controlling operation of output devices as described herein. The control circuit or system can control operation of the output device. For example, the control circuit or system can output a signal to the speaker to play a sound based on a particular area of the sensor layer being triggered. The control circuit or system can include a sound database. The control circuit or system can receive the sounds to be played from a remote source (e.g., via communications electronics such as Bluetooth). The control circuit or system can cause a visual output to display icons, animations, or other visual indicators corresponding to commands to be received by the capacitive touch device. The control circuit or system receives a sensor signal from the sensor layer. The control circuit or system can extract a location of the user input from the sensor signal. For example, the sensor signal may include the location of the user input (e.g., a two-dimensional coordinate location corresponding to the surface of the overlay layer). The control circuit or system can determine the location of the user input based on the sensor signal; for example, the sensor signal may include one or more voltage values which the control circuit can use to retrieve the location of the user input from a database (e.g., lookup table stored in a database) mapping voltage values to user input locations. The control circuit or system can determine a command indicated by the user input based on the location of the user input. For example, the control circuit or system can perform a lookup in a command database based on the location of the user input to determine the command. The control circuit or system can control operation of the output devices based on the command. In example embodiments, the toys can include adjustment knobs including volume adjustment. The toys can also include lighted displays. The lighted displays can be activated to guide the child through a series of notes.

The control system optionally generates one or more output modes. For example, a startup mode may be initiated upon switching the device on, generating a sound output such as a wake-up melody or a voice greeting. One or more operational modes may be activated by actuation of a switch or by a sequence of one or more user input contacts upon the overlay panel to trigger the capacitive touch sensors. For example, the control system may generate a play-along mode which activates one or more system-generated melodies or songs, which the user can play along with or accompany by one or more user input contacts upon the overlay panel to trigger the capacitive touch sensors to play user-generated sounds and/or generate light outputs along with the system-generated melodies or songs. The control system may also generate a free-play mode, in which the user generates melodies, songs or other output based on one or more user input contacts upon the overlay panel. The control system may also generate a user-prompting mode, wherein after a predetermined period (for example 10 or 15 seconds) of inactivity, a sound or visual output is generated to catch the user's attention. The control system may also generate an indexed play mode, wherein the system sequentially indexes through a playlist or series of songs or melodies, based on a system-initiated and/or user-initiated sequence. The control system may also generate a shut-down mode based on user inactivity and/or switching the device off, generating a shut-down melody or voice farewell. The system may also include one or more language databases, and allow user selection of the operational language, for example to switch between English, Spanish, Chinese, and/or other languages. The system optionally also includes recordable memory, allowing a user to record their activity, for example a sound recording of music and/or voice, and to selectively play back the recording. In further embodiments, the system may connect or interface with one or more external databases, artificial intelligence (AI) engines, the Internet, or other sources of information, to relate user input to relevant system output and/or to prompt additional user input. The system optionally also may include one or more wired or wireless (e.g., Bluetooth, Wi-Fi, cellular, IR, RF, etc.) communication systems, allowing the system to communicate with one or more external devices. For example, one user may play on a toy drum device according to an example embodiment of the present disclosure, while another user plays on a toy guitar device according to an example embodiment of the present disclosure, and another user plays on a toy piano device according to an example embodiment of the present disclosure, either in the same or remote locations, and the devices communicate with one another to coordinate multiple users' inputs and generate a combined multi-user output.

In example embodiments, the system of the present disclosure can be implemented in any of a variety of particular applications, in the form of different devices, systems and apparatus, enabling various modes and methods of use. For example, the system can be configured in the form of a children's toy, to resemble a range of devices such as musical instruments including a xylophone, a piano, a shaker or speaker, a guitar or ukulele, or other instrument, to generate musical sounds and/or other output. In other embodiments, the system may be configured in the form of a tablet or laptop computer, with sensor inputs generating voice, audio and/or visual outputs. The provision of a natural or simulated wood user input panel or surface may induce a perception of higher quality or improved performance among potential consumers, in comparison to products incorporating plastic or other synthetic user interface materials. In addition, the provision of a substantially continuous seamless exterior user input or interface surface, without significant crevices or recesses in or around the user input areas, prevents the accumulation of dirt, food residue or other debris, facilitates easy cleanup, and reduces the potential for debris to interfere with the product's operation. In alternative example embodiments, the provision of a wood user interface surface allows capacitive touch sensors to be incorporated into a variety of other product formats, within the scope of the present disclosure. For example, a desk, table, chair, workstation or other apparatus may comprise a wood work surface overlaying one or more capacitive touch sensors, and can function as a user interface with a computer, television, display screen, audio device, light source, or other output device, allowing the user to selectively control operation of the output device by contact with the wood user interface or user input surface. Similarly, a flooring panel or board may incorporate a wood contact surface overlaying one or more capacitive touch sensors in communication with a computer or other electronic control system, allowing the flooring material to identify the presence of one or more persons walking over an area and serving as an alarm system, personnel monitor, foot traffic counter, presence sensor, etc. In similar fashion, a customer display or informational sign may incorporate a wood display surface overlaying one or more capacitive touch sensors, and can function as an interactive customer display or informational sign.

While the invention has been described with reference to example embodiments, it will be understood by those skilled in the art that a variety of modifications, additions, and deletions are within the scope of the invention, as defined by the following claims.

What is claimed is:

1. A children's toy comprising:
    a user input panel having a top surface and a bottom surface, the top surface defining at least one user input area for touch contact by a user, wherein the user input panel comprises a natural wood material, wherein the top surface is smooth and continuous without significant crevices or recesses, and wherein the user input panel has a first material thickness in the at least one user input area and a second material thickness outside of the at least one user input area, the second material thickness being substantially greater than the first material thickness whereby at least one recess is formed in the bottom surface beneath the at least one user input area;
    at least one capacitive touch sensor positioned within a respective one of the at least one recesses formed in the bottom surface of the user input panel and in operative alignment with a respective one of the at least one user input areas, whereby touch contact by the user on the at least one user input area of the top surface of the user input panel is sensed by the at least one capacitive touch sensor through the first material thickness to generate an input signal;
    an electronic input-output control system configured to receive the input signal generated by the at least one capacitive touch sensor upon touch contact by the user on the at least one user input area, and generate a responsive output signal corresponding to a children's play mode; and
    an output device configured to receive the output signal from the control system and generate a user-perceptible children's play mode output in response thereto.

2. The children's toy of claim 1, wherein the user input panel comprises a unitary integral piece of natural wood material.

3. The children's toy of claim 1, wherein the natural wood material of the user input panel at the at least one user input area has a first material thickness of between about 1 mm to about 5 mm between the top surface and the bottom surface.

4. The children's toy of claim 3, wherein the first material thickness of the user input panel at the at least one user input area is between 2 mm to 4 mm.

5. The children's toy of claim 3, wherein the first material thickness of the user input panel at the at least one user input area is between 2.5 mm to 3 mm.

6. The children's toy of claim 1, wherein the natural wood material comprises a plywood material.

7. The children's toy of claim 1, wherein the at least one capacitive touch sensor comprises a plurality of capacitive touch sensors arranged in an array along the bottom surface of the user input panel.

8. The children's toy of claim 1, wherein the electronic input-output control system comprises a touch control integrated circuit.

9. The children's toy of claim 8, wherein the electronic input-output control system further comprises a voice/melody integrated circuit.

10. The children's toy of claim 1, wherein the output device comprises an audio speaker.

11. The children's toy of claim 1, wherein the output device comprises at least one light source.

12. The children's toy of claim 1, further comprising a capacitive touch conductive implement in the form of a mallet, drumstick or stylus.

13. The children's toy of claim 1, further comprising a housing supporting the user input panel.

14. The children's toy of claim 1, configured in the form of a musical instrument.

15. The children's toy of claim 14, wherein the musical instrument configuration is selected from a drum, a xylophone, a piano, a guitar, or a ukulele.

16. The children's toy of claim 14, further comprising at least one indicator in operative communication with the electronic input-output control system, the at least one indicator being operable in connection with an active song card selected from a plurality of interchangeable song cards to identify the selected active song card and output music corresponding to the selected active song card from the output device.

17. A children's drum toy comprising:
    a user input panel defining a plurality of simulated drum head user input areas, the user input panel comprising a natural wood material and having an exterior user input surface and an interior surface opposite the exterior user input surface, wherein the exterior user input surface is smooth and continuous without significant crevices or recesses, and wherein the user input panel has a first material thickness in the plurality of simulated drum head user input areas and a second material thickness outside of the plurality of simulated drum head user input areas, the second material thickness being substantially greater than the first material thickness whereby at least one recess is formed in the interior surface beneath the plurality of simulated drum head user input areas;
    a capacitive touch sensor associated with each of the plurality of simulated drum head user input areas, and positioned within the at least one recess formed in the interior surface of the user input panel; and
    a sound output device for generating a simulated drum sound responsive to user contact with the simulated drum head user input areas.

18. The children's drum toy of claim 17, wherein the first material thickness is between about 1 mm to about 5 mm.

19. The children's drum toy of claim 18, wherein the first material thickness is between 2 mm to 4 mm.

20. The children's drum toy of claim 19, wherein the first material thickness is between 2.5 mm to 3 mm.

21. The children's drum toy of claim 17, wherein the natural wood material comprises plywood.

22. A children's piano toy comprising:
- a user input panel in the form of a simulated keyboard, the user input panel having an exterior surface and an opposite interior surface, wherein the simulated keyboard comprises a plurality of user input areas on the exterior surface configured to resemble piano keys, the user input panel comprising a natural wood material, wherein the exterior surface is smooth and continuous without significant crevices or recesses, and wherein the user input panel has a first material thickness in the plurality of user input areas and a second material thickness outside of the plurality of user input areas, the second material thickness being substantially greater than the first material thickness whereby at least one recess is formed in the interior surface beneath the plurality of user input areas;
- at least one capacitive touch sensor associated with each of the plurality of user input areas and positioned within the at least one recess formed in the interior surface of the user input panel; and
- a sound output device for generating a simulated piano sound responsive to user contact with the plurality of user input areas.

23. The children's piano toy of claim 22, wherein the first material thickness is between about 1 mm to about 5 mm.

24. The children's piano toy of claim 23, wherein the first material thickness is between 2 mm to 4 mm.

25. The children's piano toy of claim 24, wherein the first material thickness is between 2.5 mm to 3 mm.

26. The children's piano toy of claim 22, wherein the natural wood material comprises plywood.

* * * * *